(12) United States Patent
Lee et al.

(10) Patent No.: US 7,268,396 B2
(45) Date of Patent: Sep. 11, 2007

(54) FINFETS HAVING FIRST AND SECOND GATES OF DIFFERENT RESISTIVITIES

(75) Inventors: Deok-Hyung Lee, Gyeonggi-do (KR); Byeong-Chan Lee, Gyeonggi-do (KR); Si-Young Choi, Gyeonggi-do (KR); In-Soo Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 289 days.

(21) Appl. No.: 10/937,246

(22) Filed: Sep. 9, 2004

(65) Prior Publication Data

US 2005/0104096 A1    May 19, 2005

(30) Foreign Application Priority Data

Nov. 17, 2003   (KR) .................. 10-2003-0081080

(51) Int. Cl.
*H01L 29/772* (2006.01)

(52) U.S. Cl. .................. 257/347; 257/412; 257/413; 257/E29.259

(58) Field of Classification Search ............ 257/413
See application file for complete search history.

(56) References Cited

U.S. PATENT DOCUMENTS

| | | |
|---|---|---|
| 5,844,278 A | 12/1998 | Mizuno et al. |
| 6,413,802 B1 | 7/2002 | Hu et al. |
| 7,105,934 B2 * | 9/2006 | Anderson et al. ........... 257/213 |
| 2003/0113970 A1 * | 6/2003 | Fried et al. ................. 438/286 |

OTHER PUBLICATIONS

Kedzierski et al., *Metal-Gate FinFET and Fully-Depleted SOI Devices Using Total Gate Silicidation,* International Electron Devices Meeting, Dec. 8-11, 2002, pp. 247-250.

Yu et al., *FinFET Scaling to 100nm Gate Length,* International Electron Devices Meeting, Dec. 8-11, 2002, pp. 251-254.

* cited by examiner

*Primary Examiner*—Stephen W. Smoot
(74) *Attorney, Agent, or Firm*—Myers Bigel Sibley & Sajovec, P.A.

(57) ABSTRACT

A fin field effect transistor (FinFET) includes a first gate and a second gate. The first gate has a vertical part that is defined by sidewalls of a silicon fin and sidewalls of a capping pattern disposed on the silicon fin and a horizontal part horizontally extends from the vertical part. The second gate is made of a low-resistivity material and is in direct contact with the horizontal part of the first gate. A channel may be controlled due to the first gate, and a device operating speed may be enhanced due to the second gate. Related fabrication methods also are described.

15 Claims, 28 Drawing Sheets

FINFETS HAVING FIRST AND SECOND GATES OF DIFFERENT RESISTIVITIES

RELATED APPLICATION

This application claims the benefit of Korean Patent Application No. 2003-0081080, filed Nov. 17, 2003, the disclosure of which is hereby incorporated herein by reference in its entirety as if set forth fully herein.

FIELD OF THE INVENTION

The present invention relates to semiconductor devices and methods for manufacturing the same and, more particularly, to fin field effect transistors (FinFET) and methods for fabricating the same.

BACKGROUND

As semiconductor devices are increasingly integrated various problems may arise that can degrade transistor characteristics. For example, as the channel length of a field effect transistor becomes shorter, short channel effects such as punch-through, drain induced barrier lowering (DIBL), subthreshold swing and leakage current increase, or the like, may arise.

To potentially overcome the above problems, many studies have been done for fabricating three-dimensional devices. In particular, dual gate transistor or FinFET technology has been suggested.

The FinFET technology may be categorized as two classes: using a silicon-on-insulator (SOI) substrate and using a bulk silicon substrate. A method of manufacturing a FinFET using an SOI substrate is disclosed in U.S. Pat. No. 6,413,802, and a method of manufacturing a FinFET using a bulk silicon substrate is disclosed in U.S. Pat. No. 5,844,278. The FinFETs disclosed in these patents use polysilicon as gate electrode material. Such a FinFET using a polysilicon gate may encounter problems caused by RC delay.

Bin Yu et al. discloses a FinFET with a gate stacked with a polysilicon and a silicide thereon in a paper entitled "FinFET Scaling to 10 nm Gate Length," International Electron Devices Meeting (IEDM), Dec. 8-11, 2002, pages 251-254. As disclosed in the paper, an SOI substrate is etched to form a silicon fin. A polysilicon layer is formed to cross the silicon fin (on and lateral sides of the silicon fin). A nickel silicide layer is formed on the polysilicon layer to form a stack gate electrode.

Jakub Kedzierski et al. proposed a method for fully siliciding polysilicon, in a paper entitled "Metal-gate Fin-FET and Fully-Depleted SOI Devices Using Total Gate Silicidation," International Electron Devices Meeting (IEDM), Dec. 8-11, 2002, pages 247-250. As disclosed in the paper, a nickel silicide gate is formed to cross a silicon fin.

SUMMARY

Embodiments according to the present invention can provide a semiconductor device including a first gate that can provide channel control and a second gate that can provide a wordline. A semiconductor fin has a capping pattern disposed thereon. The first gate is confined on lateral sides of the silicon fin and lateral sides of the capping pattern. The second gate intersects the capping pattern on the silicon fin and is in direct contact with the first gate outside the capping layer. Namely, the second gate is in contact with the capping pattern and the first gate outside the capping layer.

The second gate comprises a low-resistance material such as metal, silicide, metallic nitride or the like. Therefore, the total thickness of a gate stack structure can be lowered to overcome RC delay caused by a parasitic capacitance. On the other hand, the first gate is made of polysilicon. Therefore, it can control a channel and can form a dual gate in application of a CMOS device.

Further, since the second gate is in direct contact with the first gate in some embodiments, an interface characteristic therebetween can be is superior to prevent a lifting phenomenon of the second gate.

Specifically, a FinFET according to some embodiments of the present invention includes a semiconductor fin, a first gate, and a second gate. The semiconductor fin protrudes away from a substrate, and a capping pattern is disposed on the semiconductor fin. The first gate has a vertical part and a horizontal part. The vertical part is on lateral sides of the capping pattern and on the lateral sides of the semiconductor fin and the horizontal part extends horizontally from the vertical part, at substantially a right angle away from the semiconductor fin. The second gate is disposed on the vertical part of the first gate and on the capping pattern and has a lower resistivity than the first gate. A gate insulation layer is interposed between the vertical part of the first gate and the semiconductor fin. The vertical part of the first gate can control a channel, and the horizontal part thereof can provide a superior adhesive to the second gate to prevent the second gate from lifting from an underlying structure.

In exemplary embodiments, the first gate may comprise doped polysilicon, and the second gate may comprise metal, metallic nitride, metallic silicide, and/or combinations thereof. The metal of the second gate may be tungsten, molybdenum, and/or titanium. The metallic silicide of the second gate may be cobalt silicide, nickel silicide, titanium silicide, and/or tungsten silicide. The metallic nitride of the second gate may be tungsten nitride and/or titanium nitride. The above materials are merely exemplary.

In exemplary embodiments, the capping pattern may comprise oxide or nitride and/or stacked layers of oxide and nitride in this order. The capping pattern is relatively thicker than the gate insulation layer, so that a top of the semiconductor fin does not act as a channel.

In exemplary embodiments, the FinFET further includes a lower insulation layer surrounding a bottom of the semiconductor fin and an upper insulation layer on the lower insulation layer. Namely, the first gate is disposed on the sidewalls of the semiconductor fin, the sidewalls of the capping pattern, and the upper insulation layer. As a result, the second gate is not in direct contact with the upper insulation layer.

In exemplary embodiments, the lower insulation layer comprises oxide and nitride stacked in this order, and the upper insulation layer comprises oxide. Alternatively, the lower insulation layer comprises nitride and the upper insulation layer comprises oxide.

In exemplary embodiments, the substrate may be an SOI substrate. Namely, a buried oxide layer is interposed between the semiconductor fin and the substrate.

Embodiments according to the present invention can also provide methods of fabricating a semiconductor device. The methods include confining a first gate on sidewalls of a semiconductor fin having a capping pattern and below a capping pattern through a planarizing process and forming a second gate on the first gate and on the capping pattern.

Specifically, methods of fabricating a semiconductor device provide a substrate having an outwardly protruding semiconductor fin on which a capping pattern is disposed, form a nitride liner along an entire surface of the substrate and form an upper insulation layer on the nitride liner. The upper insulation layer is planarized down to a top surface of the nitride liner on the capping pattern. The planarized upper insulation layer is partially removed to allow its height to be lower than a height of the capping pattern, and the nitride liner is partially removed to expose sidewalls of the semiconductor fin. These methods continue by forming a gate insulation layer on the sidewalls of the exposed semiconductor fin, forming a first gate layer having a top surface lower than that of the capping pattern, forming a second gate layer having a lower resistivity than the first gate layer on the first gate layer and the capping pattern, patterning the second gate layer down to top surfaces of the capping pattern and the first gate layer to form a second gate crossing the semiconductor fin, and etching the first gate layer outside of the second gate down to a top surface of the remaining nitride liner to form a first gate.

In exemplary embodiments, forming the first gate layer comprises forming a polysilicon layer on the sidewalls of the semiconductor fin, the lowered upper insulation layer, and the capping pattern and planarizing the polysilicon layer by using the capping pattern as a planarization stop layer. Therefore, the polysilicon layer can be confined on the sidewalls of the semiconductor fin and the sidewalls of the capping pattern and a height of the polysilicon can be equal or lower than a height of the top surface of the capping pattern. Thus a doping concentration of the polysilicon layer and a type of a dopant can be suitably regulated to control a channel and to fabricate a CMOS device.

Using an oblique ion implanting process, the dopants are implanted into the polysilicon layer. That is, after etching the first gate layer outside of the second gate, impurities (dopants) are implanted into the first gate sidewalls of the semiconductor fin by using the capping pattern and the lowered upper insulation layer as an ion-implanting mask.

In exemplary embodiments, forming the second gate comprises forming a low-resistivity metal layer on the first gate and the capping pattern, forming a gate mask on the low-resistivity metal layer, and etching the metal layer exposed by the gate mask.

In exemplary embodiments, a metallic silicide layer is formed before forming the low-resistivity metal layer. The metallic silicide layer may be formed by a deposition process such as tungsten silicide.

In exemplary embodiments, partially removing the nitride liner to expose the sidewalls of the semiconductor fin may precede partially removing the planarized upper insulation layer to allow its height to be lower than the height of the capping pattern.

In exemplary embodiments, preparing the upwardly protruding semiconductor fin comprises preparing a silicon substrate, after sequentially forming a pad oxide layer and a pad nitride layer on the silicon substrate, performing a patterning process to form the capping pattern, and etching the silicon substrate exposed by the capping pattern. In this case, these methods may further comprise forming a lower insulation layer to cover a lower side of the semiconductor fin before forming the nitride liner.

In exemplary embodiments, providing the upwardly protruding semiconductor fin comprises preparing an SOI substrate, after sequentially forming a pad oxide layer and a pad nitride layer on a silicon substrate on the SOI substrate, performing a patterning process to form the capping pattern, and etching the SOI substrate exposed by the capping pattern down to a top surface of a buried oxide layer of the SOI substrate.

In exemplary embodiments, these methods further comprise forming an oxide liner before forming the nitride liner. The oxide liner can prevent the pad nitride layer of the capping pattern from being etched when the nitride liner is partially removed.

In exemplary embodiments, planarizing the upper insulating layer further comprises simultaneously planarizing the upper insulation layer, the nitride liner, and the pad nitride layer down to a top surface of the pad oxide layer of the capping pattern. In this case, before partially removing the planarized upper insulation layer, a thermal oxidation process is performed to form a capping pattern comprising oxide.

Embodiments according to the present invention can also provide other methods of fabricating a semiconductor device. These methods provide a substrate having an outwardly protruding semiconductor fin on which a capping pattern is formed, form a nitride liner along an entire surface of the substrate, form an upper insulation layer on the nitride liner, planarize the upper insulation layer down to a top surface of the nitride liner on the capping pattern, and partially remove the planarized upper insulation layer to allow its height to be lower than a height of the capping pattern. The nitride liner is partially removed to expose sidewalls of the semiconductor fin. A gate insulation layer is formed on the exposed sidewalls of the semiconductor fin. A polysilicon layer is formed on the lowered upper insulation layer and on the gate insulation layer formed on the exposed sidewalls of the semiconductor fin. A sacrificial insulation layer is formed on the polysilicon layer wherein the sacrificial insulation layer has a groove crossing the semiconductor fin. A refractory metal layer is formed on the exposed polysilicon layer and the sacrificial insulation layer in the groove. A silicide annealing process is performed to convert the polysilicon layer on the capping pattern below the groove into a silicide layer, thereby forming a second gate. Non-reacted metal layer and the sacrificial insulation layer are removed, and using the second gate as an etch mask, the exposed un-reacted polysilicon is etched to form a first gate remaining below the second gate and the sidewalls of the semiconductor fin and the capping pattern.

Embodiments according to the present invention can provide yet other methods of fabricating a semiconductor device. These methods comprise providing an outwardly protruding semiconductor fin on which a capping pattern is formed, forming a lower insulation layer covering a lower side of the semiconductor fin to electrically isolate the semiconductor fin, forming a gate insulation layer on the lower insulation and an exposed sidewall of the semiconductor fin by the capping pattern, forming a first gate layer on the gate insulation layer and the lower insulation layer wherein the first gate layer has the same height as the capping pattern or lower height than the height of the capping pattern, and forming a second gate layer on the first gate layer and the capping pattern, the second gate layer having a lower resistivity than the first gate layer. The second gate layer is patterned down to top surface of the capping pattern and the first gate layer to form a second gate crossing the semiconductor fin. The first gate layer is etched outside of the second gate down to a top surface of the lower insulation layer to form a first gate.

Embodiments according to the present invention can provide still other methods of fabricating a semiconductor device. These methods comprise providing an outwardly protruding semiconductor fin on which a capping pattern is formed, forming a lower insulation layer covering a lower side of the semiconductor fin to electrically isolate the semiconductor fin, forming a gate insulation layer on the lower insulation and an exposed sidewall of the semiconductor fin by the capping pattern, and forming a polysilicon layer on the capping pattern, the gate insulation layer, and the lower insulation layer wherein a top surface of the polysilicon layer is higher than a top of the capping pattern. A sacrificial insulation layer is formed on the polysilicon layer wherein the sacrificial layer has a groove crossing the semiconductor fin. A refractory metal layer is formed on the exposed polysilicon layer and the sacrificial insulation layer in the groove. A silicide annealing process is performed to convert the polysilicon layer on the capping pattern below the groove into a silicide layer, thereby forming a second gate. Non-reacted metal layer and the sacrificial insulation layer are removed, and using the second gate as an etch mask, the exposed nun-reacted polysilicon is etched to form a first gate remaining below the second gate and the sidewalls of the semiconductor fin and the capping pattern.

BRIEF DESCRIPTION OF THE DRAWINGS

FIG. 6A through FIG. 13A are perspective views to explain methods of forming a FinFET shown in FIG. 1A.

FIG. 6B through FIG. 13B are cross-sectional views corresponding to FIG. 6A through FIG. 13A, respectively.

DETAILED DESCRIPTION

Figure 1A:
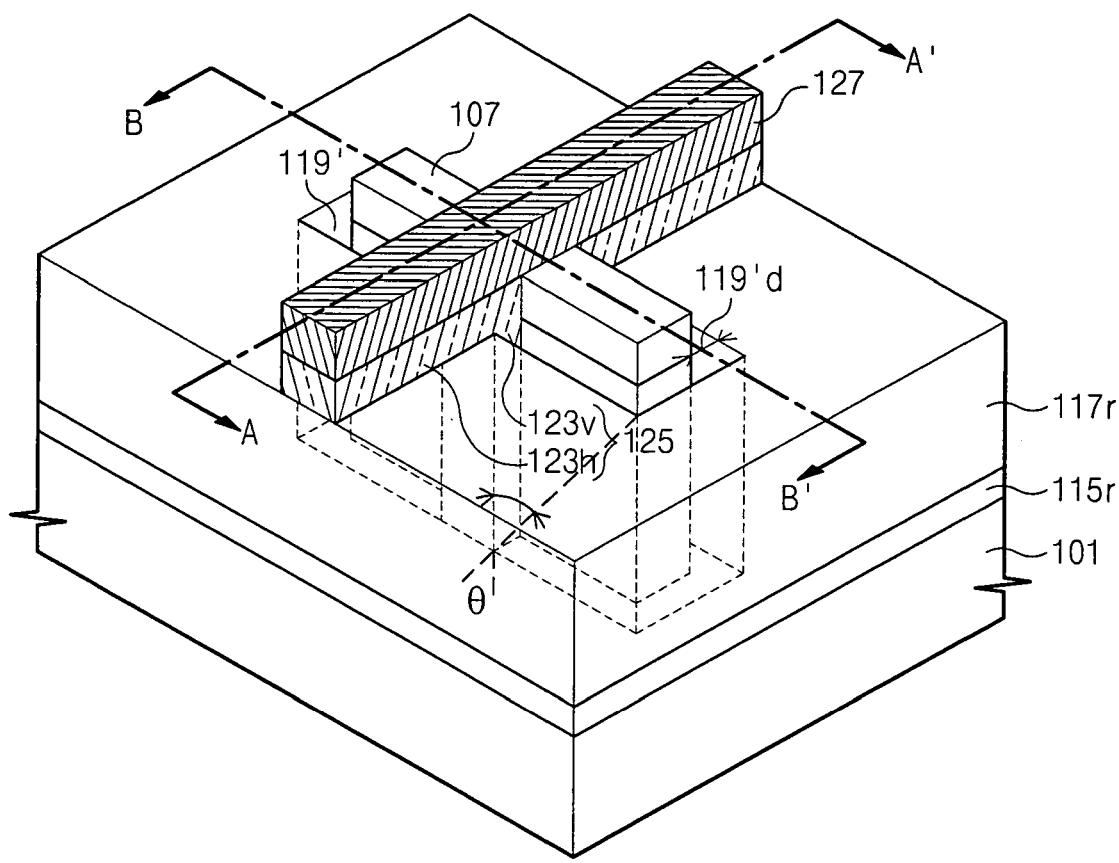
FIG. 1A is a schematic diagram of a fin field effect transistor (FinFET) according to embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a layer illustrated as having a smooth surface will, typically, have some roughness rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 1B:
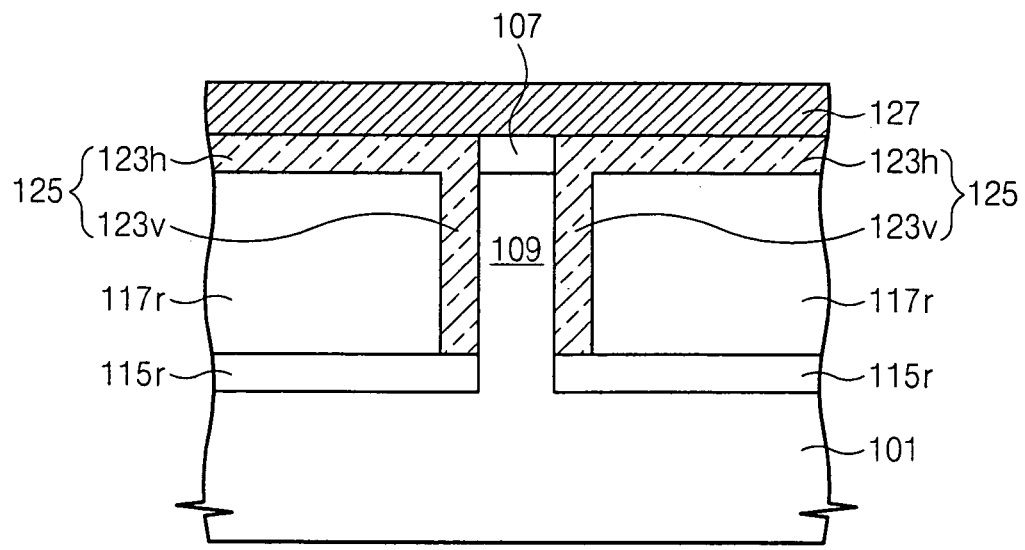
FIG. 1B and FIG. 1C are cross-sectional views taken along lines A-A' and B-B' of FIG. 1A, respectively.
Figure 1C:
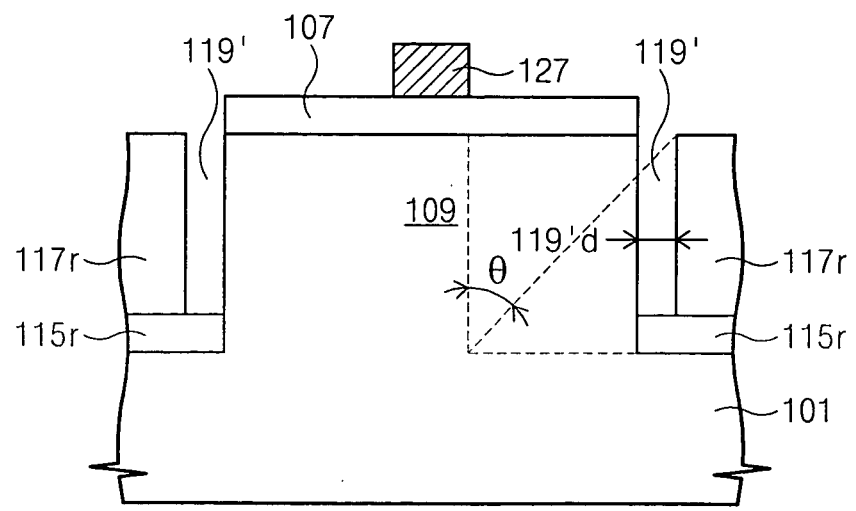

Referring to FIG. 1A through FIG. 1C, a semiconductor device, i.e., fin field effect transistor (FinFET) includes a silicon fin 109 and a gate comprising a first gate 125 and a second gate 127. The first gate 125 has a vertical part 123v and a horizontal part 123h. The silicon fin 109 protrudes outwardly (upwardly in FIG. 1A) from a substrate 101 to define sidewalls and a top surface. A capping pattern 107 is disposed on the top surface of the silicon fin 109. The vertical part 123v of the first gate 125 can serve to control a channel and is disposed on the sidewalls of the capping pattern 107 and the silicon fin 109. The horizontal part 123h of the first gate 125 extends laterally from the vertical part 123v of substantially a right angle. A top surface of the horizontal part 123h is disposed over the top surface of the silicon fin 109 and below a top surface of the capping pattern 107. The horizontal part 123h of the first gate 125 can provide a superior interface characteristic with the second gate 127.

The second gate 127 crosses over the first gate 125, more specifically, the top surface of the first gate 125 and the top surface of the capping pattern 107. That is, the second gate 127 is in contact with the capping pattern 107 over the silicon fin 109 and is contact with the horizontal part 123h of the first gate outside the silicon fin 109.

The first gate 125 can comprise polysilicon and may be doped with impurities to be suitable to its characteristic. For example, in case of an NMOS transistor, N-type impurities are doped polysilicon and in case of a PMOS transistor, P-type impurities are doped polysilicon. The amount of the doped impurities may be controlled to control the channel.

The second gate 127 comprises low-resistance metal, metallic nitride, silicide and/or combinations thereof. The low-resistance metal is tungsten, molybdenum, titanium and so forth. The metallic nitride is tungsten nitride, titanium nitride and so forth. The silicide material is cobalt silicide, nickel silicide, titanium silicide, tungsten silicide and so forth. Moreover, the above-mentioned materials are merely exemplary.

The capping pattern 107 comprises pad oxide and pad nitride, which are stacked in this order, or oxide. Although not shown in this figure, a gate insulation layer is disposed between the vertical part 123v of the first gate 125 and the silicon fin 109. The capping pattern 107 may be relatively thicker than a gate insulation layer such that only the sidewalls of the silicon fin 109 can act as a channel.

A lower insulation layer 115r surrounds a bottom (lower sidewalls) of the silicon fin 109. With a predetermined space 119'd from the silicon fin 108, an upper insulation layer 117r is formed on the lower insulation layer 115r to surround the vertical part 123v of the first gate 125. That is, a top surface of the upper insulation layer 117r is in contact with a bottom surface of the horizontal part 123h of the first gate 125.

The first gate 125, more specifically, the vertical part 123, is doped with impurities using an oblique ion implantation. Using the upper insulation layer 117r and the capping pattern 107 as an ion implanting mask, impurities are obliquely implanted into the vertical part 123v of the first gate 125 exposed through a space area 119'. In this case, a tilt angle of the oblique ion implantation is θ.

The lower insulation layer 115r may comprise, for example, silicon nitride, and the upper insulation layer 117r may comprise silicon oxide.

FinFETs according to other embodiments of the present invention are illustrated in FIG. 2 through FIG. 5 which are cross-sectional views taken along the gate (a line A-A') of FIG. 1A.

Figure 2:
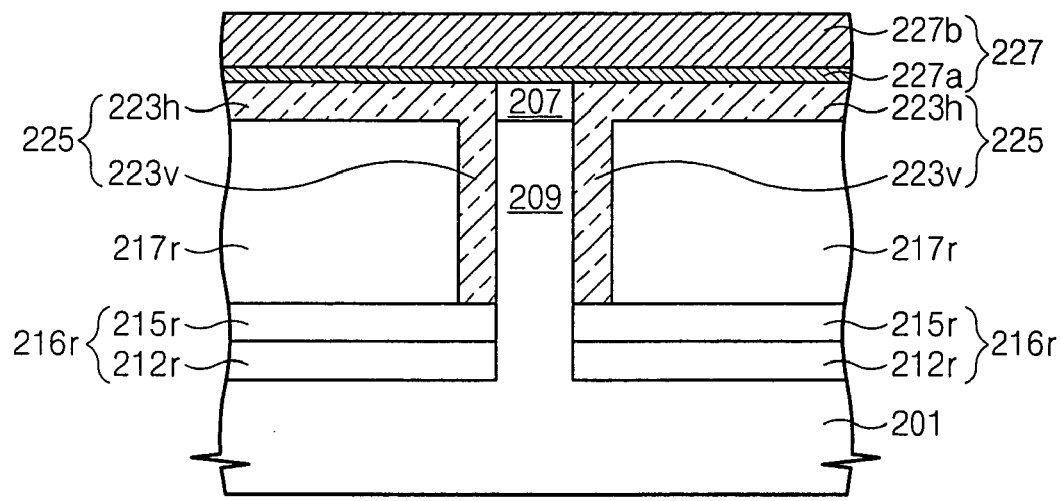
FIG. 2 through FIG. 5 are cross-sectional views of FinFETs according to other embodiments of the present invention.

Referring to FIG. 2, a FinFET according other embodiments can be identical to the FinFET shown in FIG. 1A through FIG. 1C except that an oxide layer 212r is further disposed below the lower insulation layer 115 of FIG. 1A through FIG. 1C. That is, in these embodiments, oxide 212r and nitride 215r are stacked in this order to constitute a lower insulation layer 216r. A second gate 227 comprises silicide 227a and metal 227b, which are stacked in this order. Alternatively, the second gate 227 may comprise metal or silicide.

Figure 3:
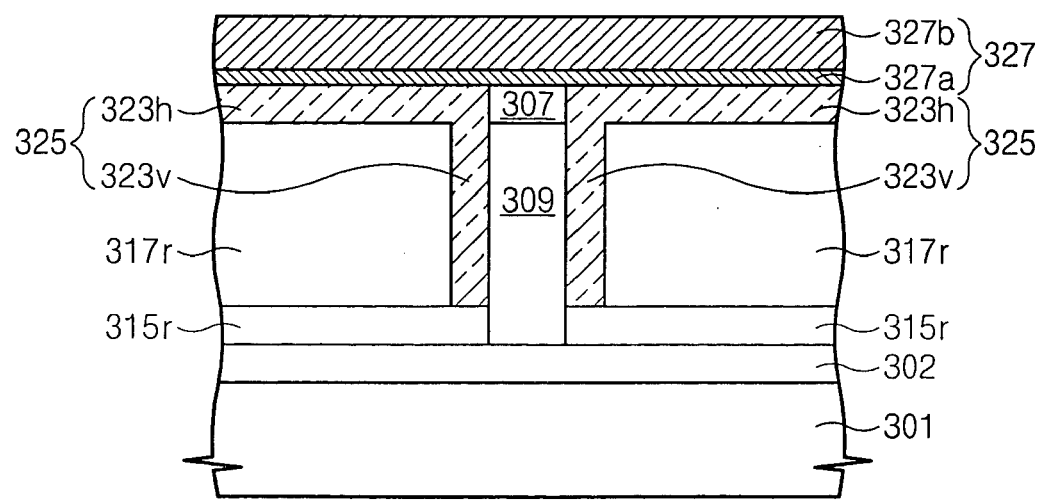

Referring to FIG. 3, a FinFET according to other embodiments can be identical to the FinFET shown in FIG. 1A through FIG. 1C except that a substrate 301 and a silicon fin 309 are electrically insulated by a buried oxide layer 302. That is, a FinFET according to these embodiments is formed on an SOI substrate (a substrate having a stack structure of first silicon-buried oxide-second silicon).

Figure 4:
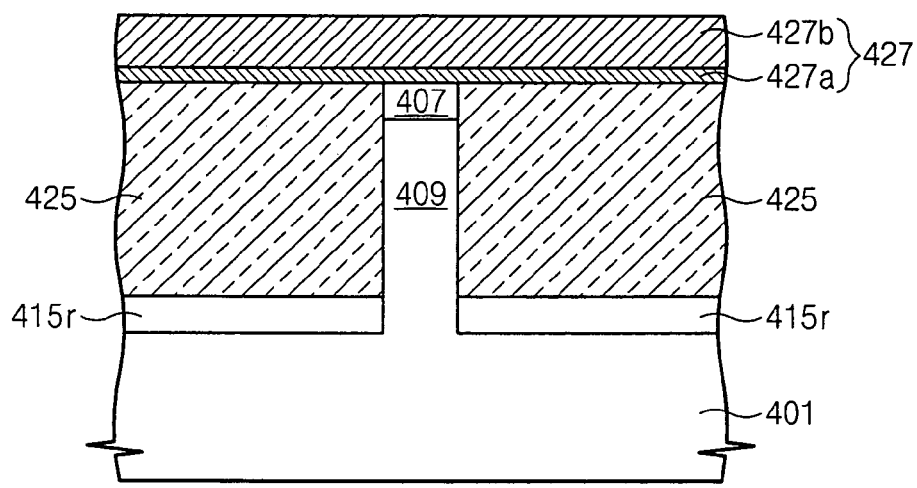

Referring to FIG. 4, a FinFET according to other embodiments includes a silicon fin 409 and a gate comprising a first gate 425 and a second gate 427. The silicon fin 409 extends from a substrate 401, and a capping pattern 407 is disposed on the silicon fin 409. The first gate 425 surrounds sidewalls of the capping pattern 407 and the silicon fin. Although not shown in the figure, a gate insulation layer is interposed between the silicon fin 409 and the first gate 425. The second gate 427 is in contact with the capping pattern 407 and the first gate 425. The lower insulation layer 415r surrounds a bottom (bottom side) of the silicon fin 409. The silicon fin 409 is electrically connected to a substrate 401. The second gate 427 is made of silicide 427a and metal 427b, which are stacked in this order. Alternatively, the second gate 427 may be made of metal or silicide.

Figure 5:
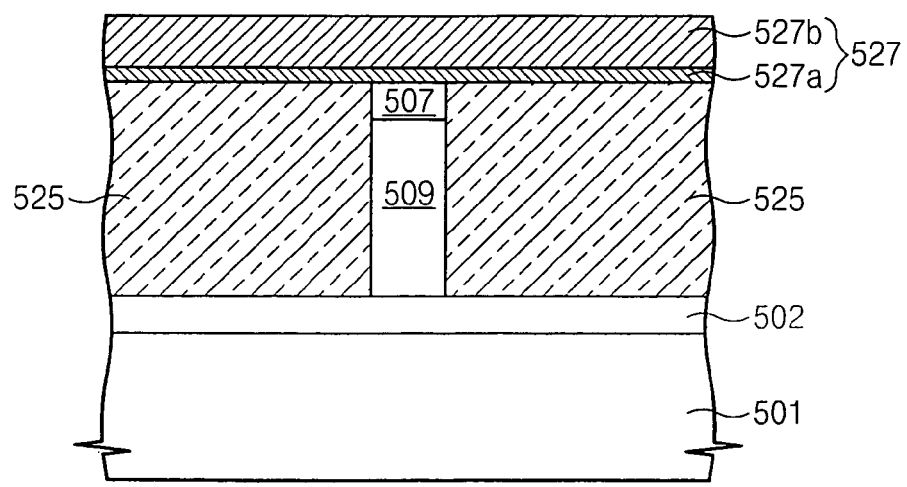

Referring to FIG. 5, a FinFET according to other embodiments can be identical to the FinFET shown in FIG. 4 except that a substrate 501 is electrically insulated from a silicon fin 509 by a buried oxide layer 502.

While it has been described in the above exemplary embodiments that a FinFET has only one silicon fin, it is clear to a person skilled in the art that the FinFET may have two silicon fins or more.

Methods of forming the above-described FinFETS will now be described hereinafter with reference to attached drawings.

A method of forming a FinFET shown in FIG. 1A through FIG. 1C will now be described more fully with reference to FIG. 6A through FIG. 13A and FIG. 6B through FIG. 13B.

Figure 6A:
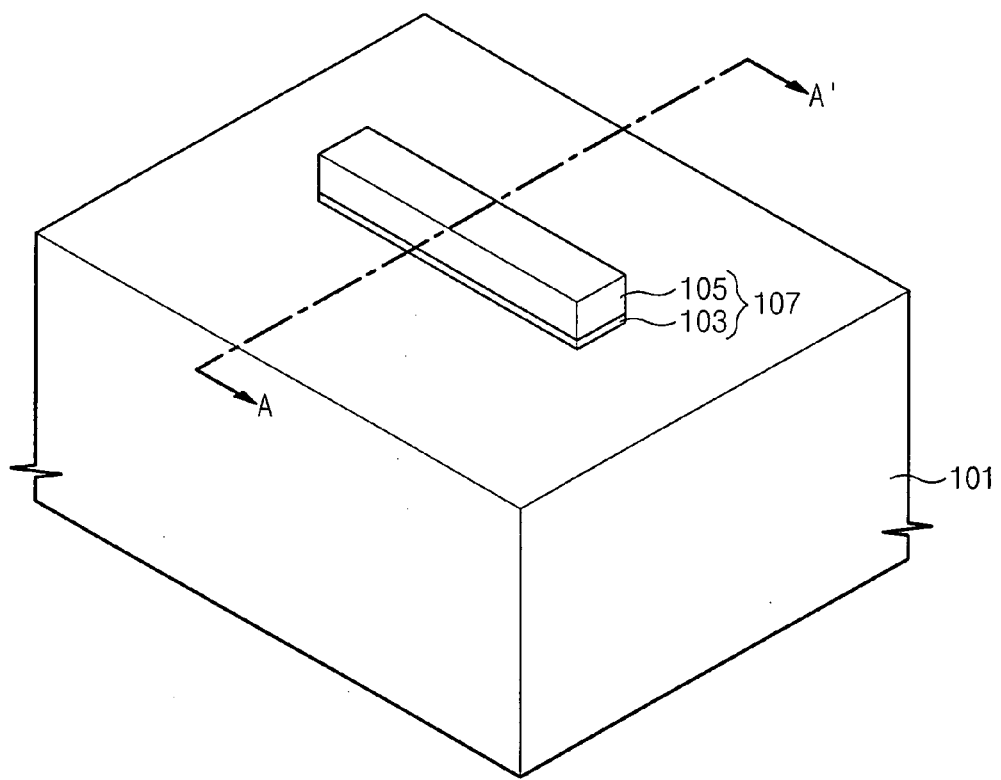
Figure 6B:
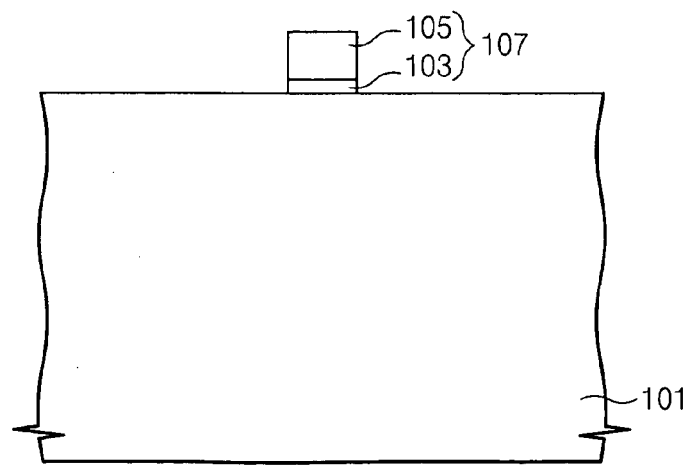

Referring to FIG. 6A and FIG. 6B, a capping pattern 107 is formed on a substrate 101 to define a semiconductor fin 107. The substrate 101 is, for example, a semiconductor substrate comprising monocrystalline silicon. The capping pattern 107 comprises pad oxide 103 and pad nitride 105 which are stacked in this order. The capping pattern 107 may be formed by the following manner: The substrate 101 is thermally oxidized to form a thermal oxide or a thin film deposition such as a chemical vapor deposition (CVD) is performed to form a CVD oxide layer 103 on the substrate 101. Using a conventional thin film deposition such as CVD, a silicon nitride layer 105 is formed on the thermal or CVD oxide layer. A photolithographic process is performed to complete formation of the capping pattern 107.

Figure 7A:
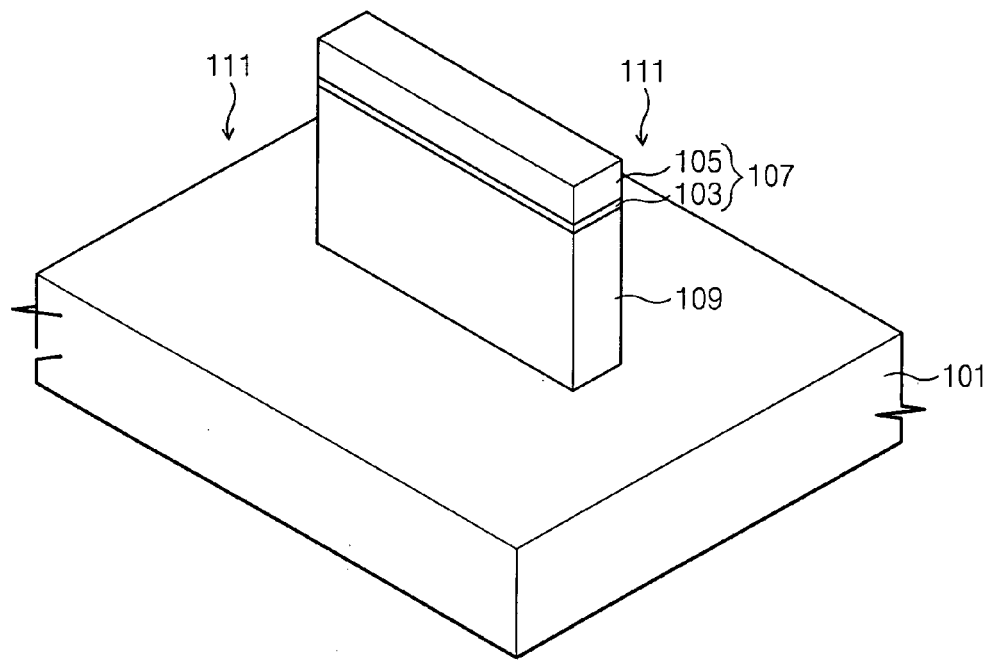
Figure 7B:
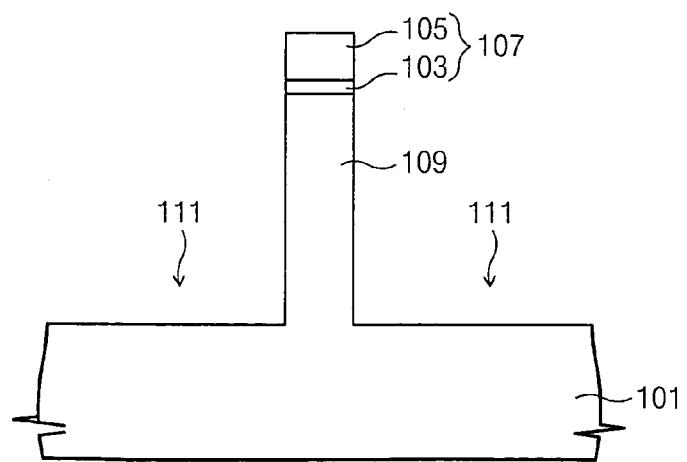

Referring to FIG. 7A and FIG. 7B, using the capping pattern 107 as an etch mask, a substrate exposed thereby is etched to a silicon fin, i.e., a silicon fin 109 and a trench 111. Although only one silicon fin 109 is illustrated in this figure, it is clear to a person skilled in the art that a number of silicon fins are formed.

Figure 8A:
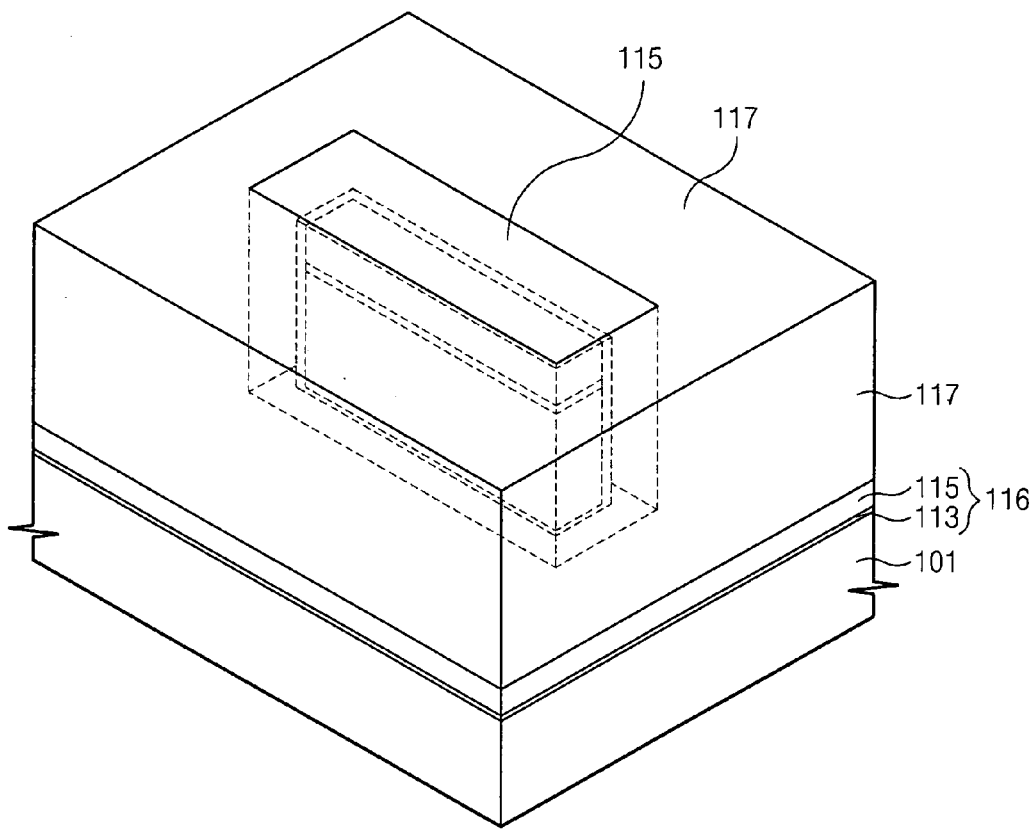
Figure 8B:
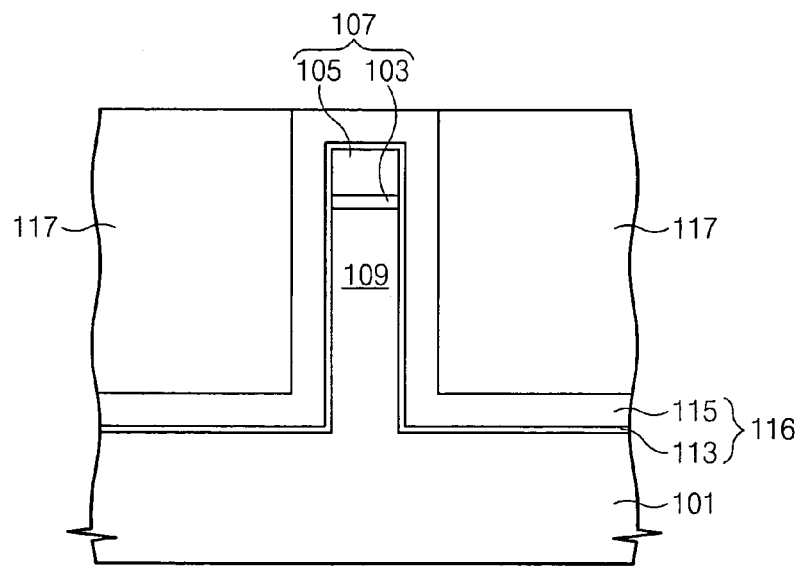

Referring to FIG. 8A and FIG. 8B, an oxide liner 113 is formed using a CVD technique. In some embodiments, the oxide liner 113 has an etch selectivity with respect to the pad oxide layer 103 of the capping pattern 107. For example, in the case that the pad oxide layer 103 is made of thermal oxide, the oxide liner 113 may be formed using a CVD technique.

A nitride liner 115 is formed on the oxide liner 113. The nitride liner 115 is relatively thicker than the oxide liner 113. The nitride liner 115 and the oxide liner 113 constitute a lower insulation layer 116. The nitride liner 115 is formed using a conventional CVD technique.

After an upper insulation layer is formed on the nitride liner 115 to fill the trench 111, a planarizing process is performed down to a top surface of the nitride liner to form an upper insulation layer 117 having a planar top surface. The upper insulation layer 117 may comprise high-density plasma oxide.

Figure 9A:
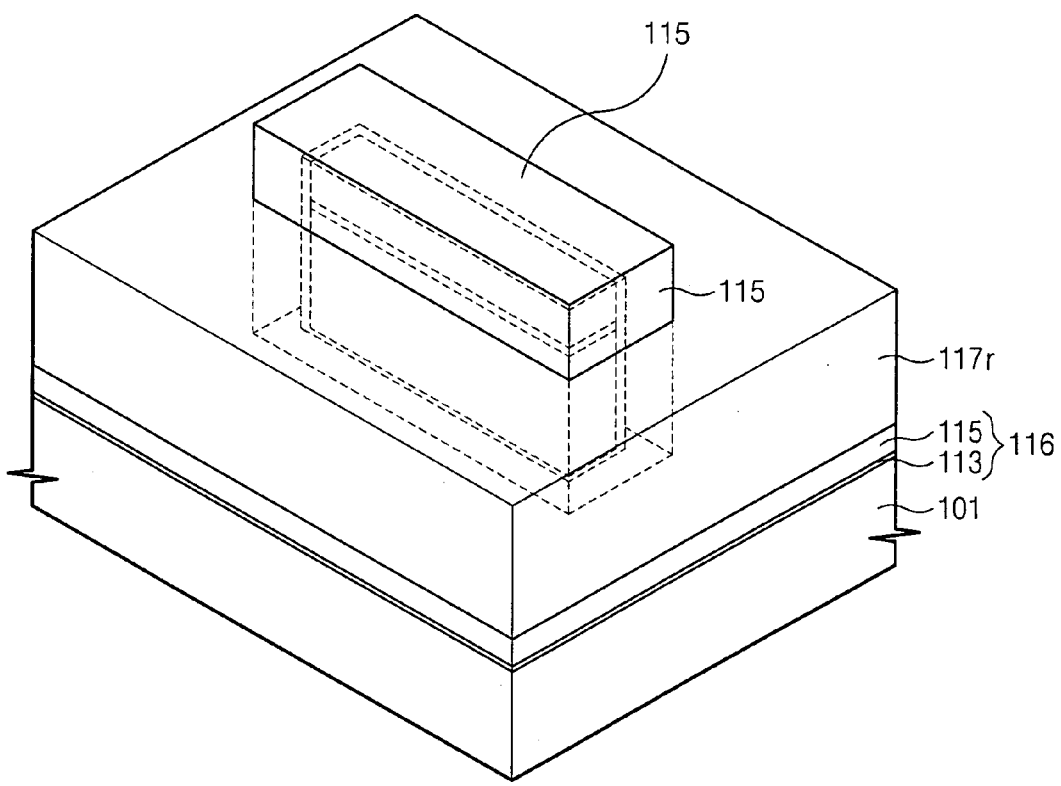
Figure 9B:
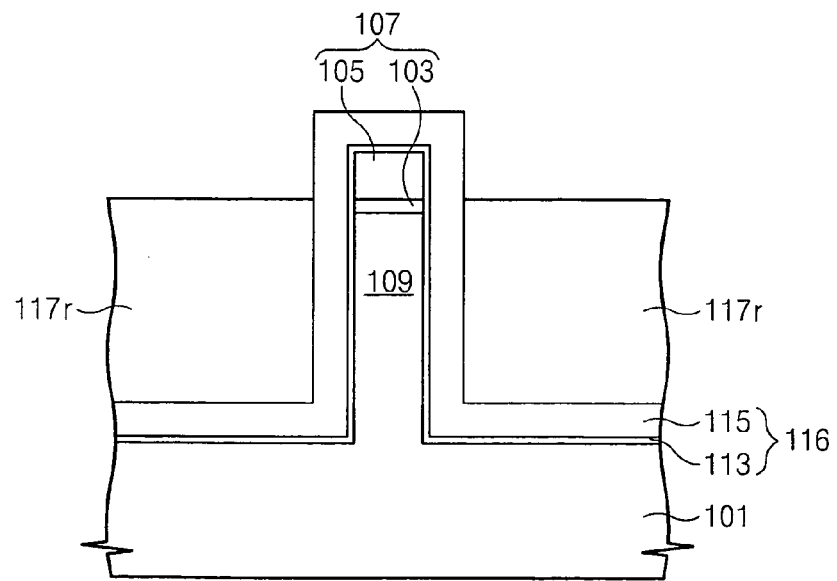

Referring to FIG. 9A and FIG. 9B, for example, an etch-back process is performed to lower a height of the planarized upper insulation layer 117. In this case, the lowered height of the upper insulation layer 117r is higher than that of a top surface of the silicon fin 109. The etch-back process uses an etch gas to selectively etch the oxide layer 117 with respect to the nitride liner 115. Alternatively, a wet etchant may be used.

The planarizing process of FIG. 8A (and FIG. 8B) and the etch-back process of FIG. 9A (and FIG. 9B) may be replaced by one process, i.e., an etch-back process. That is, an insulation layer is formed on the nitride liner 115 to fill the trench 111 and then is etched back such that its height is lower than the height of the top surface of the capping pattern 107 and higher than the height of the top surface of the silicon fin 109. Instead of using the etch-back process to lower the height of the upper insulation layer, a wet etchant may be used to lower the height of the upper insulation layer.

Herein, the height of the upper insulating layer 117 can be lowered simultaneously removing partially oxide liner 113 after removing partially nitride liner 115.

Figure 10A:
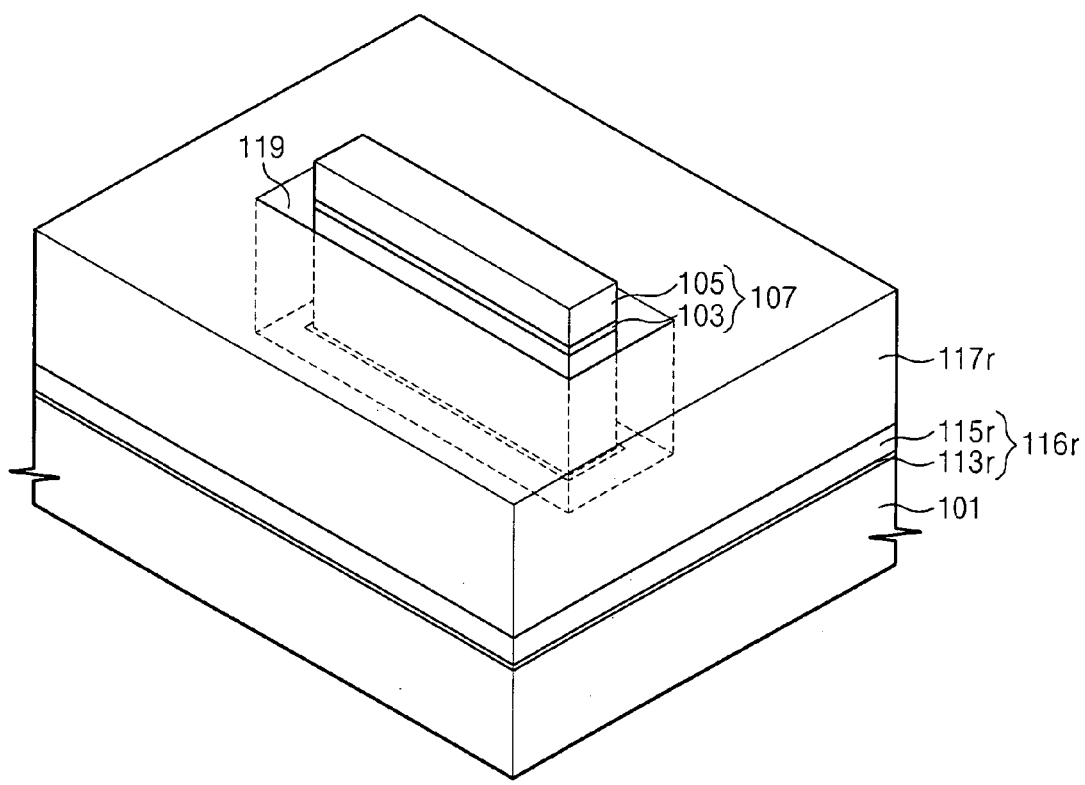
Figure 10B:
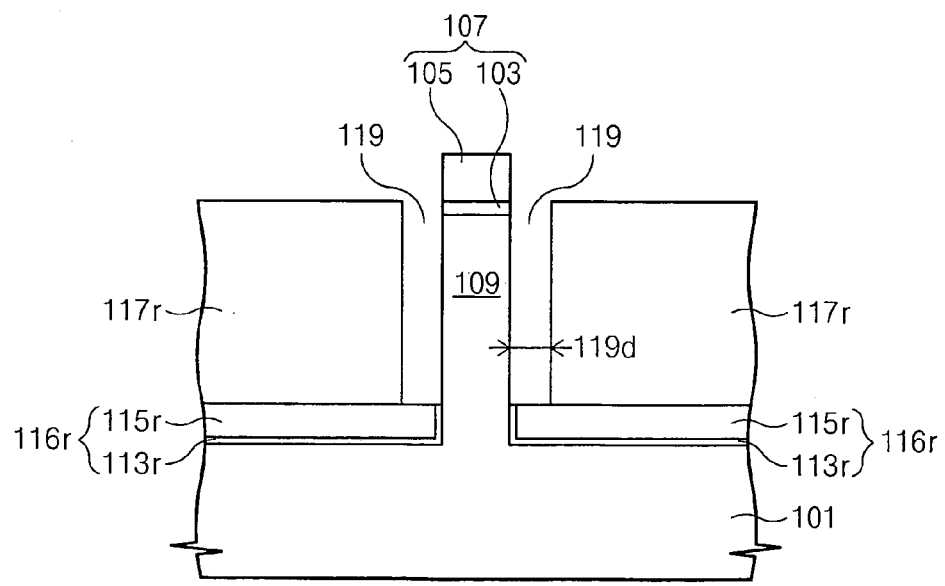

Referring to FIG. 10A and FIG. 10B, the nitride liner 115 and the oxide liner are partially removed to expose sidewalls of the silicon fin 109. Thus a space area 119 having an interval 119d is formed between the upper insulation layer 117r and the silicon fin 109. That is, the space area 119 is formed along a circumference of the silicon fin 109 to have a shape corresponding to a shape of the silicon fin 109 from top plan view, e.g., rectangular tube shape (see FIG. 1A). Specifically, the nitride liner 115 is partially removed using a wet etchant such as phosphoric acid or a suitable dry etchant. Due to the oxide layer 113, the pad nitride 105 of the capping pattern 107 is not etched. Using hydrofluoric acid or a suitable etch gas, the exposed oxide liner 113 is partially removed to expose the sidewall of the silicon fin 109 and the capping pattern 107. Consequently, the lower insulation layer 116r remains on the bottom of the trench 111 to surround the bottom side of the silicon fin 109. The removal amount of the nitride liner 115 and the oxide liner 113 is determined in view of the height of the silicon fin 109 and a channel height. Further, it is clear to a person skilled in the art that the removal amount thereof may be varied according to processes.

Figure 11A:
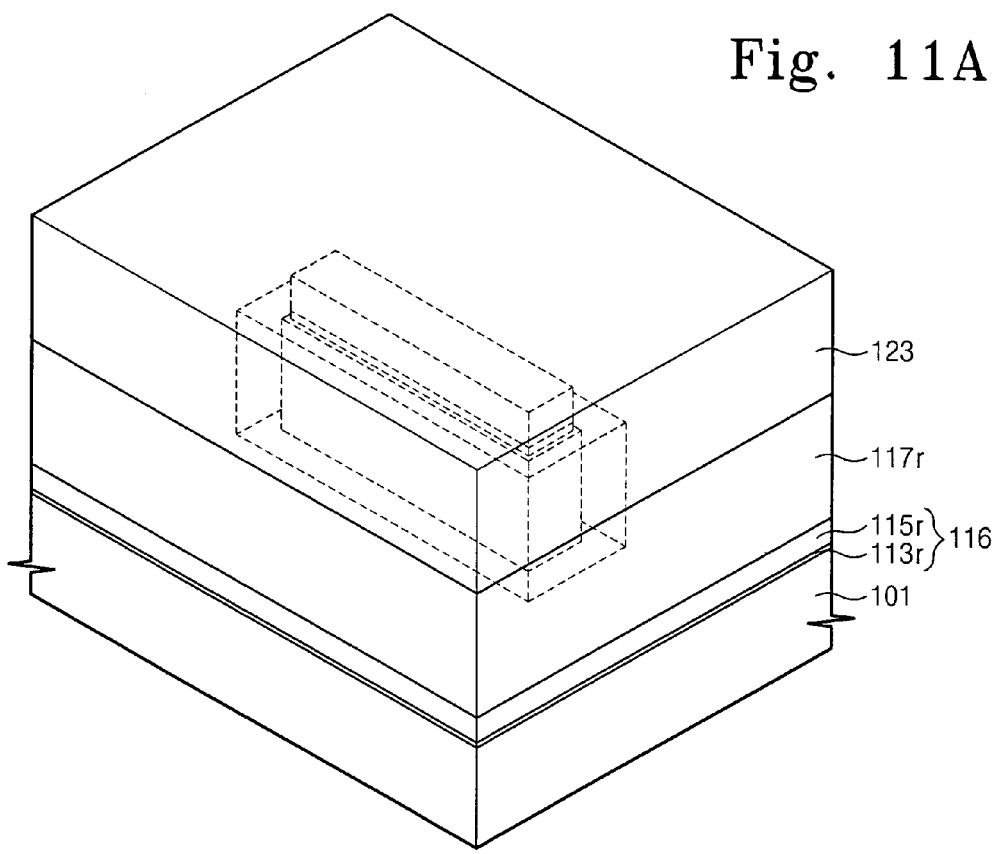
Figure 11B:
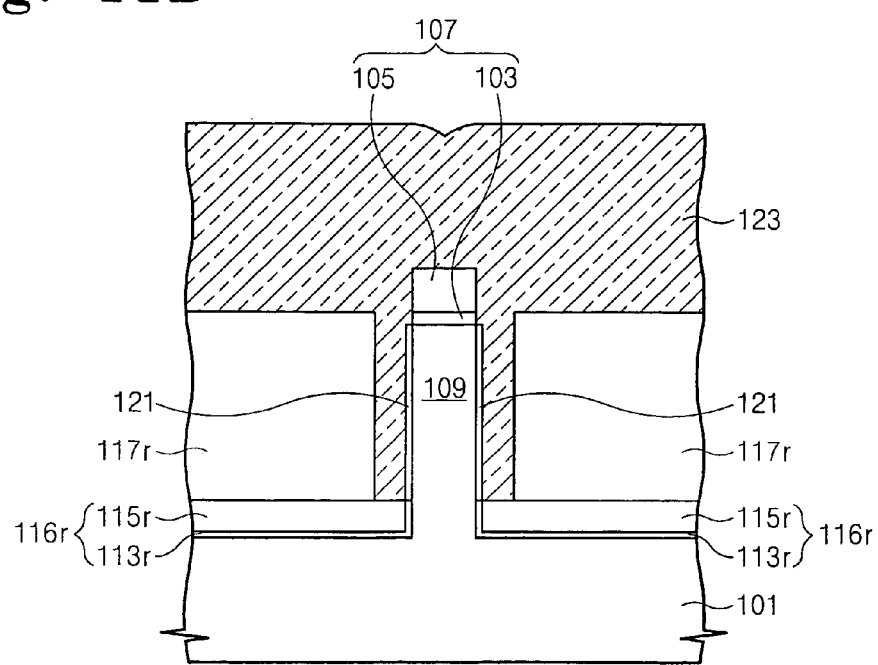

Referring to FIG. 11A and FIG. 11B, after a gate insulation layer 121 is formed on the sidewall of the silicon fin 109, a first gate material 123 is formed on the upper insulation layer 117r to fill the space area 119 and cover the capping pattern 107. In some embodiments, the first gate material 123 comprises polysilicon. The polysilicon is doped to have a desired conduction type by an in-situ deposition process or is not doped by in-situ doping. If the polysilicon is not doped by the in-situ doping, impurities of desired conductive type may be implanted by an oblique ion implantation in a subsequent process. In the case where a CMOS device is formed, an in-situ doping process may be independently performed for an NMOS transistor and a PMOS transistor. Meanwhile, in the case that the in-situ doping is not performed, an oblique ion implanting process may be independently performed in a subsequent process.

Further in this stage, although the polysilicon is in-situ doped to have an opposite conduction type to desired conduction type, impurities of the desired conductive type are obliquely implanted in a subsequent process to be doped with the desired conduction type impurities. For example, in the case where a CMOS device is formed, polysilicon is doped with first conduction type impurities by in-situ doping. After exposing a portion to be doped with impurities of a second conduction type in a subsequent oblique ion implanting process, the impurities of the second conduction type are obliquely implanted to form a dual gate.

Figure 12A:
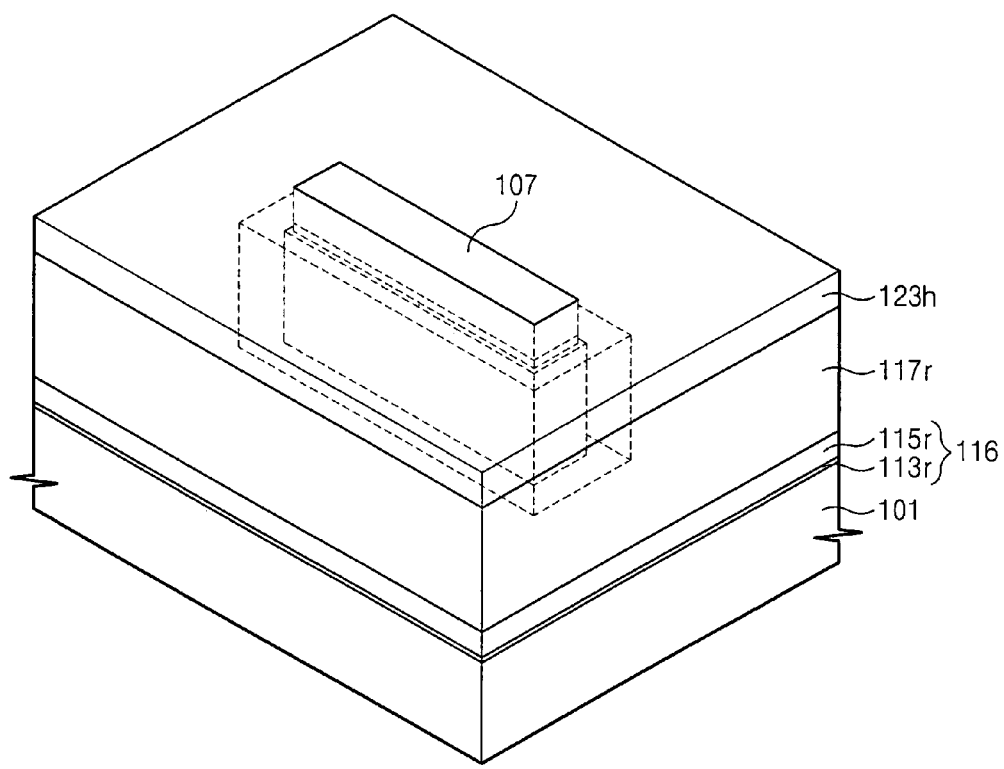
Figure 12B:
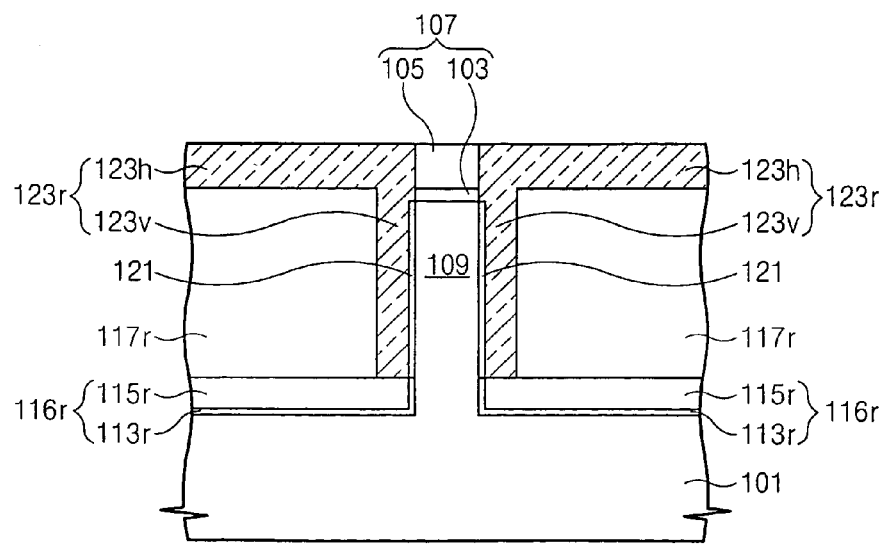

Referring to FIG. 12A and FIG. 12B, the first gate material 123 is planarized down to a top surface of the capping pattern 107 to lower its height. Thus the height of a top surface of the first gate material 123r is substantially equal to that of the top surface of the capping pattern 107. The planarized first gate material 123rv comprises a vertical part 123rh and a horizontal part 123rh. The vertical part 123rv is a part filling the space area 119 and is confined to the sidewall of the silicon fin 109 and the sidewall of the capping pattern 107. The vertical part 123rh is disposed on an entire top surface of the lowered upper insulation layer 117r. The height of a top surface of the vertical part 123rh is substantially equal to that of the top surface of the capping pattern 107.

An overetch is performed during the planarizing process or an etch-back is performed following the planarizing process, so the height of the top surface of the horizontal part 123rh may be lower than that of the height of the capping pattern 107.

Figure 13A:
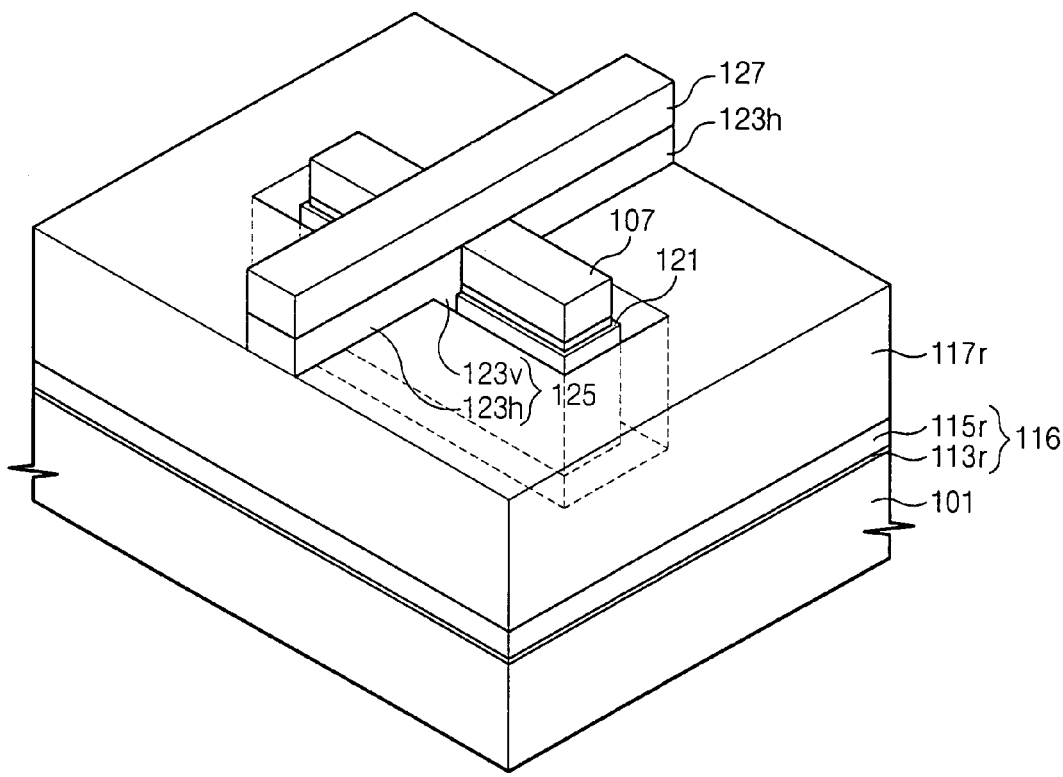
Figure 13B:
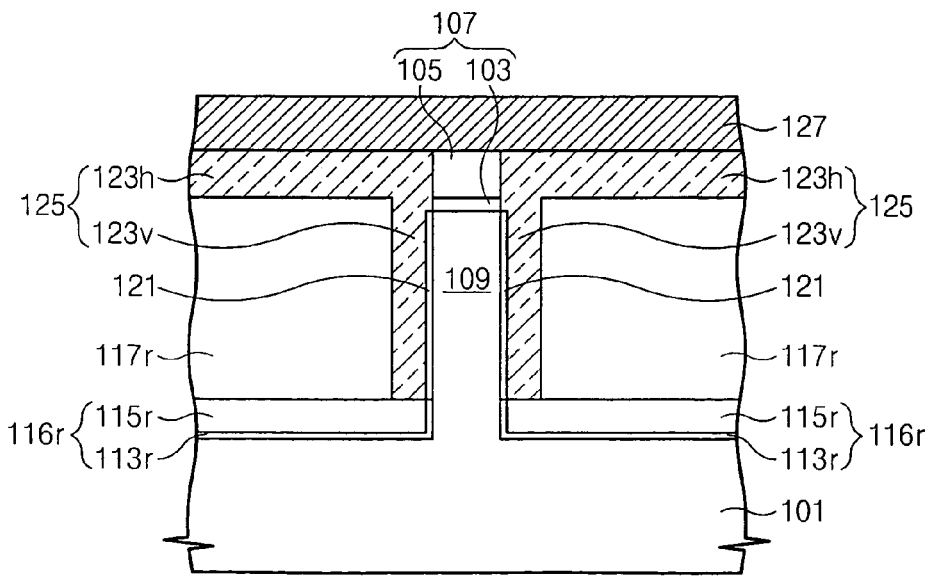

Referring to FIG. 13A and FIG. 13B, a metallic material is formed on the capping pattern 107 and the first gate material 123r. A gate etch mask (not shown) is formed on the metallic material. Prior to formation of the metallic material, a silicide layer may be further formed by a deposition process. The metallic material exposed by the gate etch mask is etched to form a second gate 127 crossing the silicon fin 109. The second gate 127 is configured as a linear gate. The first gate material 123r outside of the second gate 127 is selectively removed to form a first gate 125. As a result, the first gate 125 remains below the second gate 127. More specifically, the first gate 125 remains on the sidewalls of the silicon fin 109 and the capping pattern 107 and on the upper insulation layer 117r. Namely, the first gate 125 comprises a vertical part 123v aligned below the second gate 127 to remain on the sidewalls of the silicon fin 109 and the capping pattern 107 and a horizontal part 123h aligned below the second gate 127 to remain on the upper insulation layer 117r (i.e., intervene between the second gate and the upper insulation layer).

Figure 14:
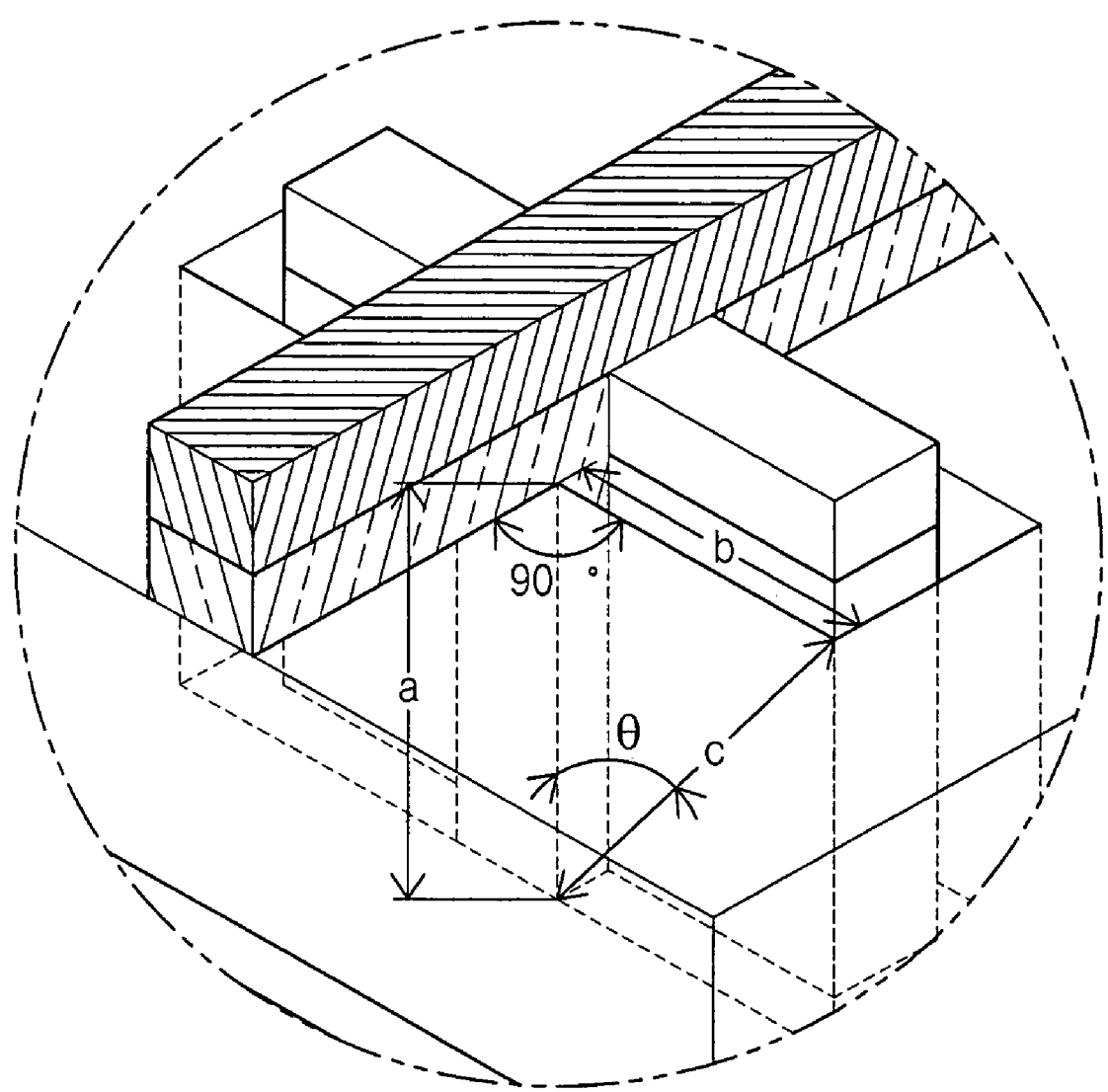
FIG. 14 is an enlarged view of a portion of FIG. 1A to explain gate-doping methods according to the present invention.

As a subsequent process, an oblique ion implanting process is performed as follows. Using the upper insulation layer 117r and the capping pattern 107 as an ion-implanting mask, impurities are implanted into a first gate (vertical part) disposed on the sidewall of the silicon fin 109. This will be described with reference to FIG. 1A and FIG. 14. FIG. 14 is an enlarged view of a part of the FIG. 1A.

Referring to FIG. 1A, the first gate material 123r outside of the second gate 127 is removed to complete formation of the first gate 125 and to form a space area 119'. The space area 119' exposes the vertical part 123v of the first gate 125. Following formation of the first gate 125, using the upper insulation layer 117r and the capping pattern 107 as an ion implanting mask, impurities of desired conduction type are obliquely implanted into the exposed vertical part 123v of the first gate 125. In this case, a tilt angle of the oblique ion implantation is θ. The tilt angle θ may be obtained using a trigonometric function.

For example, $\cos\theta = a/c$, $\tan\theta = b/a$, wherein a represents a horizontal distance between the lowered upper insulation layer and the polysilicon first gate, b represents a vertical height of the lowered insulation layer from the bottom of the polysilicon first gate, and c represents a distance between the bottom of the polysilicon first gate and the top surface of the upper insulation layer.

Methods of forming a second gate made of silicide will now be described with reference to FIG. 15A through FIG. 15E. To avoid duplicate description, the same processes as described above will be omitted.

Figure 15A:
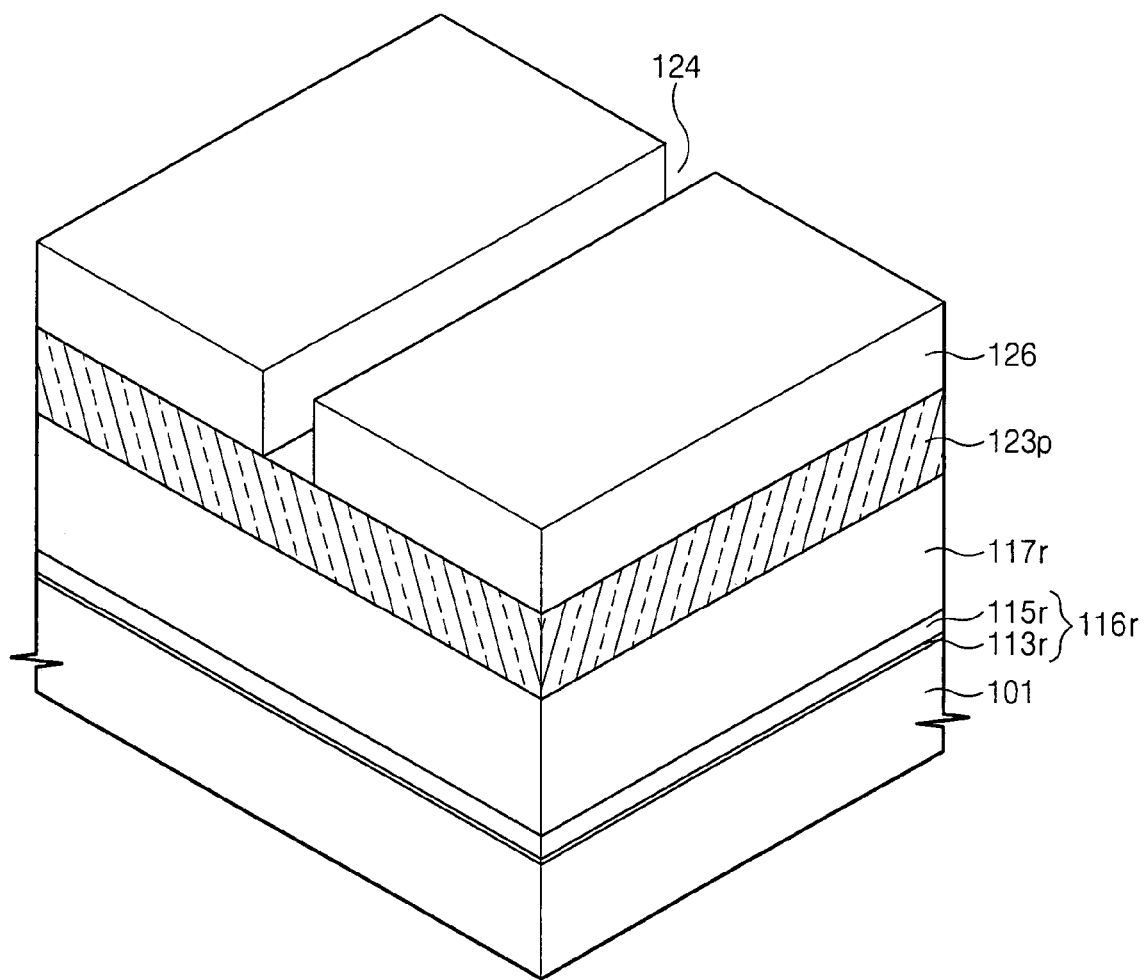
FIG. 15A through FIG. 15E are perspective view to explain methods of forming a FinFET according to other embodiments of the present invention.

After performing the processes described above in FIG. 6A through FIG. 11A and FIG. 6B through FIG. 11B, a planarizing process is performed to form a first gate material 123p on the capping pattern 107, as shown in FIG. 15A. The first gate material 123p has a predetermined thickness from a top surface of the capping pattern 107. A sacrificial insulation pattern 126 is formed on the first gate material to define a second gate. The sacrificial insulation pattern 126 has a groove 124, and the second gate is configured as a linear gate. The groove 124 may be formed by a conventional photolithographic process.

Specifically, after forming a sacrificial insulation layer on the first gate material 123p, an etch mask (not shown) is formed to define a groove. The sacrificial insulation layer exposed by the etch mask is etched down to a top surface of the first gate material 123p to form a groove 124. An etch mask pattern is then removed.

Figure 15B:
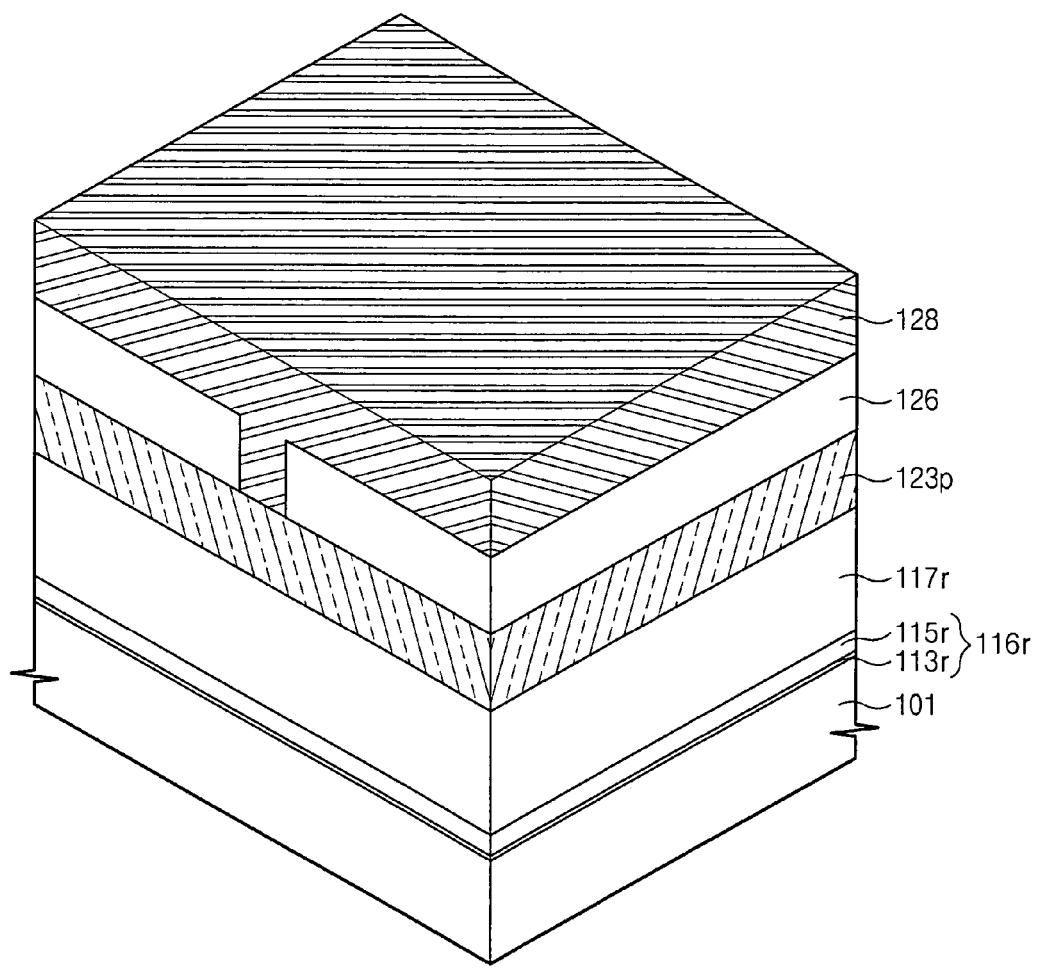

Referring to FIG. 15B, a metallic material 128 is formed on the sacrificial insulation pattern 126 to fill the groove 124. The metallic material 128 reacts with the polysilicon, which is the first gate material, to form silicide. The metallic material 128 comprise a refractory metal such as nickel, cobalt, titanium, tungsten, and/or the like.

Figure 15C:
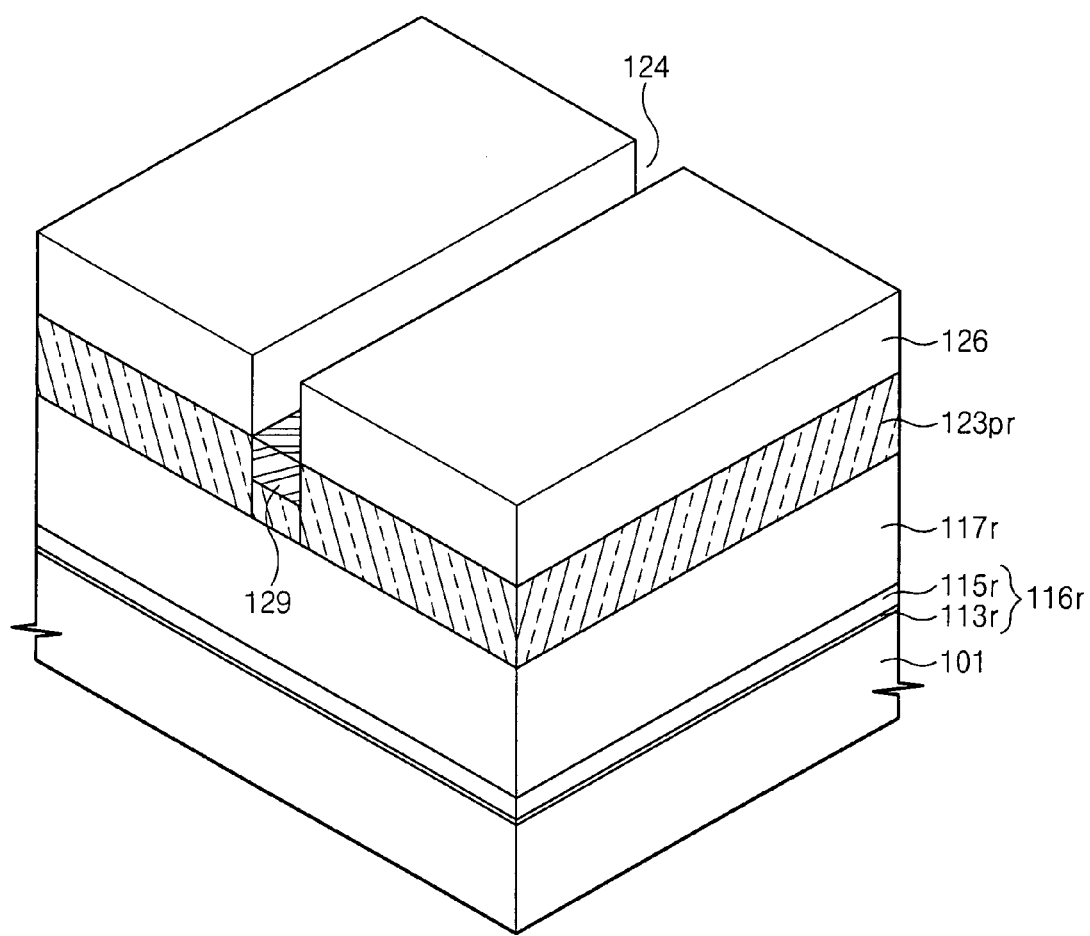

Referring to FIG. 15C, a conventional silicide annealing process is performed to form a silicide layer 129 as a second gate aligned below the groove 124. Since the first gate material 123p is exposed by the groove 124 (i.e., the metallic material 128 and the first gate material 123p are in contact with each other at the bottom of the groove 124), the first gate material below the groove 124 reacts with the metallic material if silicide-annealing process is performed. As a result, the silicide layer 129 is formed to be aligned below the groove 124.

In this case, the silicide annealing process may be suitably regulated to prevent silicidation of the first gate material formed at the sidewall of the silicon fin 109. That is, a bottom surface of the silicide layer 129 is disposed under a top surface of the capping pattern 107 but disposed to be over the top surface of the silicon fin 109.

Figure 15D:
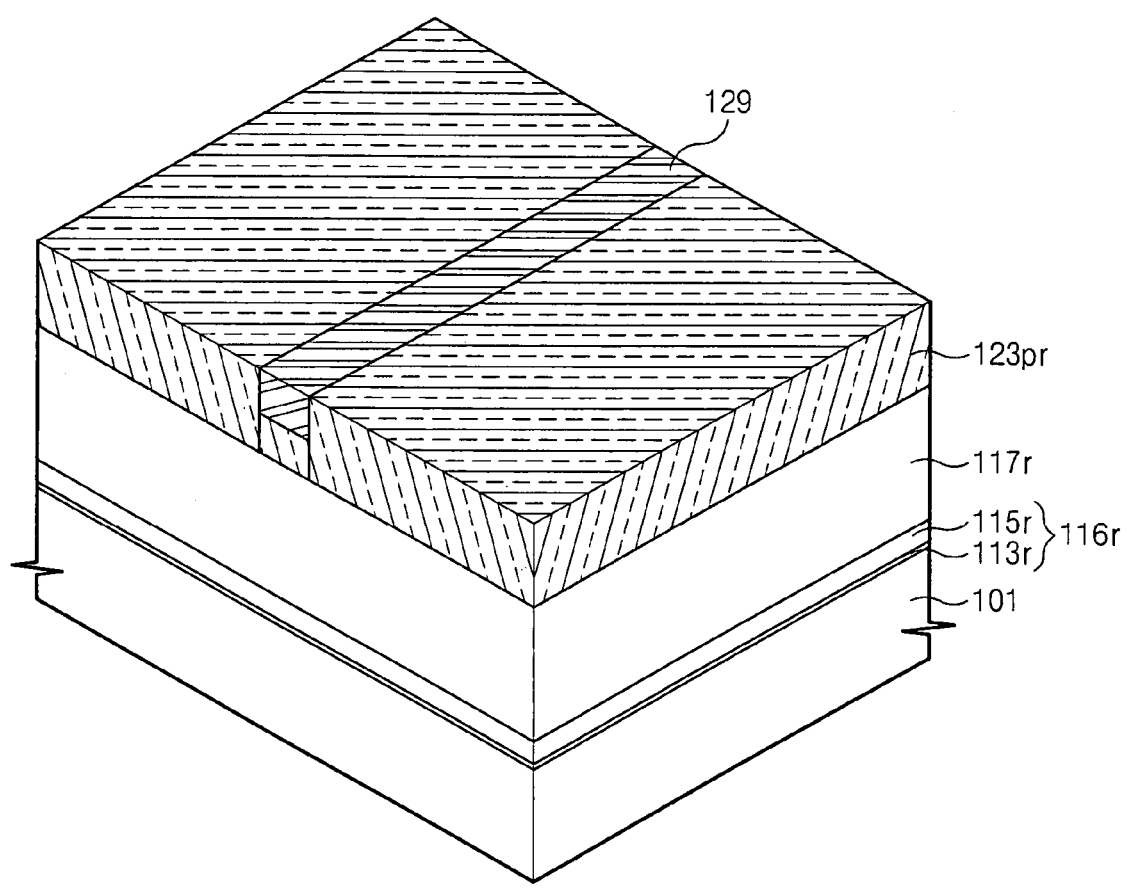

Unreacted metallic material is removed, and the sacrificial insulation pattern 126 is removed (see FIG. 15D).

Figure 15E:
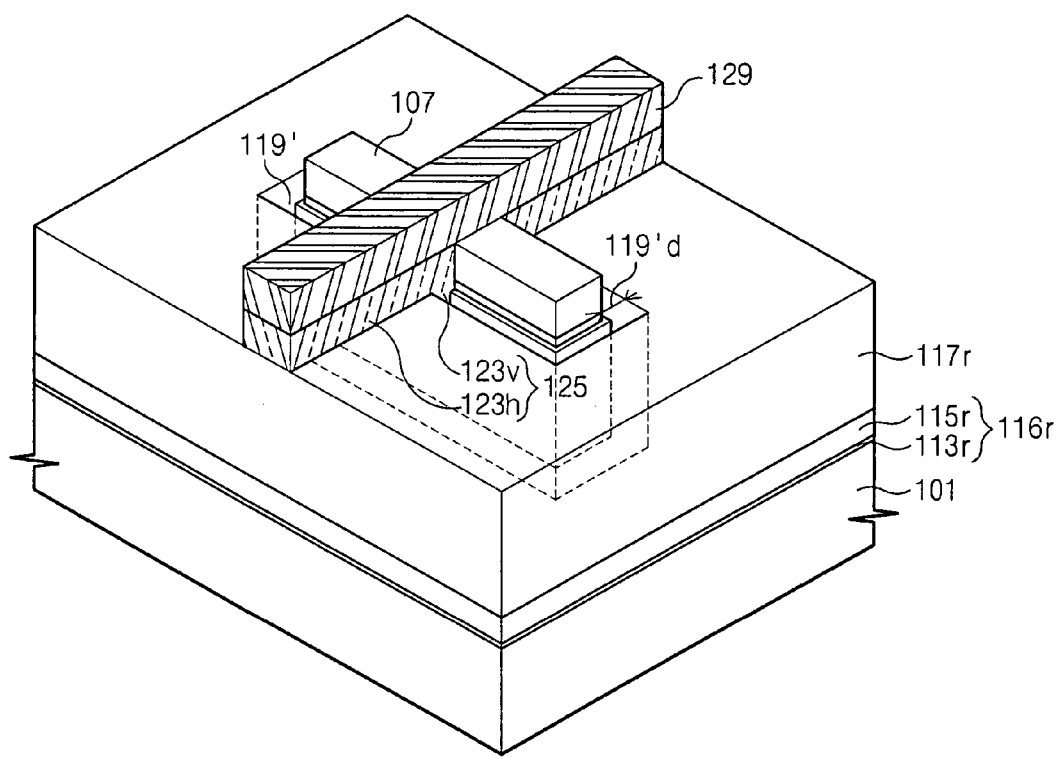

Referring to FIG. 15E, using the silicide layer 129 as an etch mask, the first gate material, which is exposed thereby and outside thereof, is removed to form the first gate 125.

An oblique ion implanting process is then performed to implant impurities into the vertical part 123v of the first gate 125.

Methods of forming a FinFET according to other embodiments of the present invention will now be described with reference to FIG. 16A through FIG. 16C. In these embodiments, a capping pattern comprises oxide. The same processes as described in FIG. 6A through FIG. 13A and FIG. 6B through FIG. 13B will not be described in further detail.

Figure 16A:
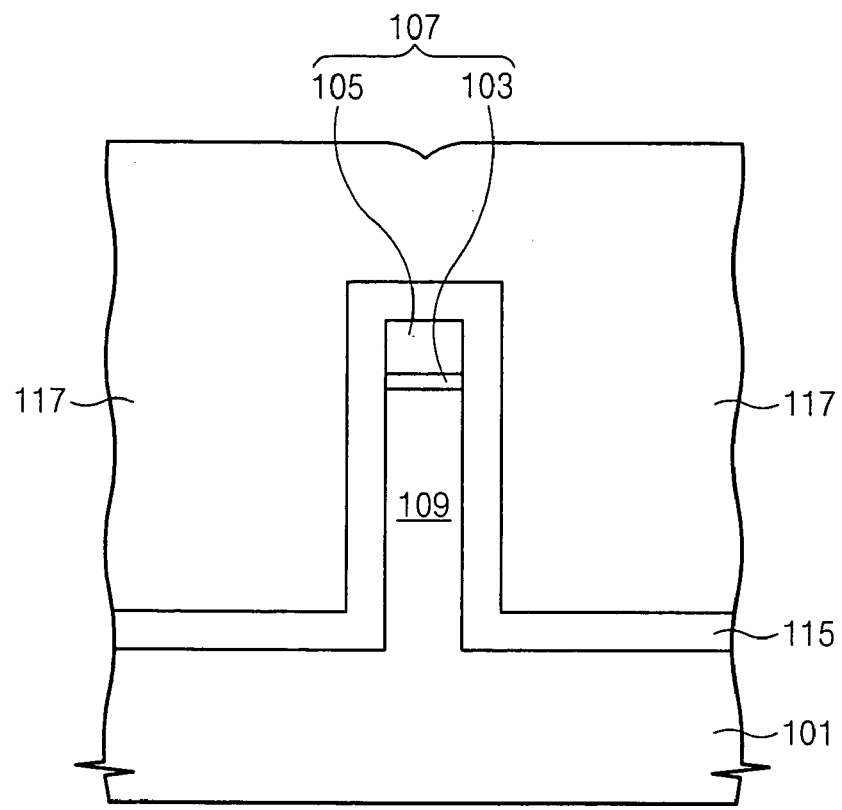
FIG. 16A through FIG. 16C are cross-sectional views to explain methods of forming a FinFET according to still other embodiments of the present invention.

Referring to FIG. 16A, a capping pattern 107, a trench 111, a silicon fin 109, and a nitride liner 115 are formed by the same manner as described in FIG. 6A and FIG. 7A and FIG. 6B and FIG. 7B. An upper insulation layer 117 is formed on the capping pattern to fill the trench 111.

Figure 16B:
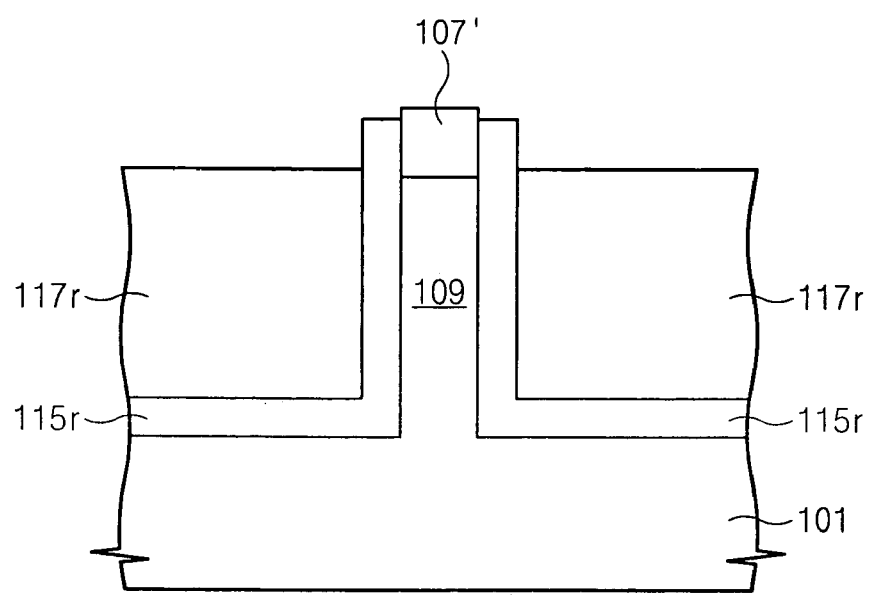

Referring to FIG. 16B, a planarizing process is performed to planarized the upper insulation layer 117, the nitride liner 115, and a pad nitride layer 105 of the capping pattern 107 down to a top surface of a pad oxide layer 103 of the capping pattern 107. A thermal oxidation process is then performed to oxidize a top of the silicon fin 109. Thus, a capping pattern 107' of oxide is formed. The planarized upper insulation layer is partially removed to make its height lower than the top surface of the capping pattern 107'.

The planarizing process that can simultaneously etch oxide and nitride and is performed down to a top surface of the pad oxide layer 130 of the capping pattern 107 by regulating planarization time. In some cases, the top surface of the silicon fin 109 may be exposed.

Alternatively, using the nitride liner 115 as a planarization stop layer, the upper insulation layer 117 is planarized. After a part of the exposed nitride liner 115 and the pad nitride layer 105 of the capping pattern 107 are simultaneously removed, a thermal oxidation process is performed to oxidize the top of the silicon fin 109. Thus, the capping pattern 107' of oxide is formed. Thereafter, the upper insulation layer 117 is etched back or wet etched to lower its height.

Figure 16C:
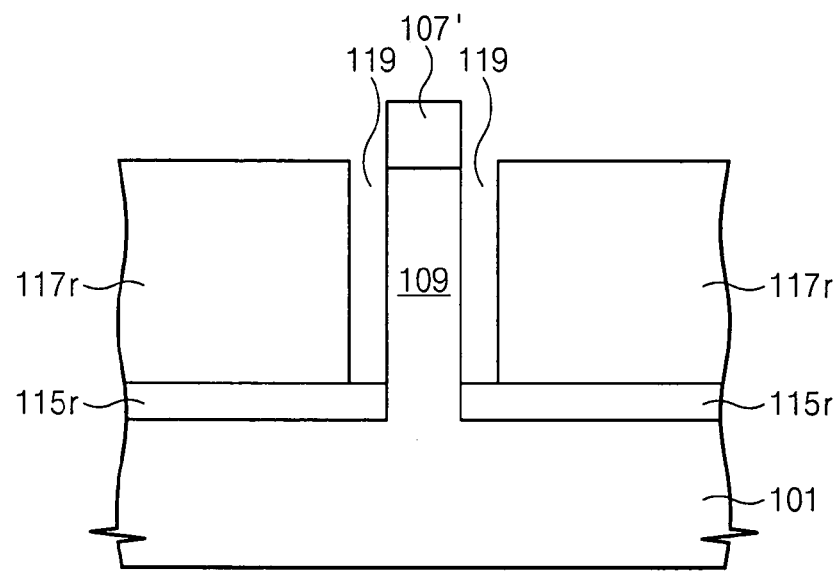

Referring to FIG. 16C, the nitride liner 115p is partially removed to expose lateral faces of the silicon fin 109.

Figure 17:
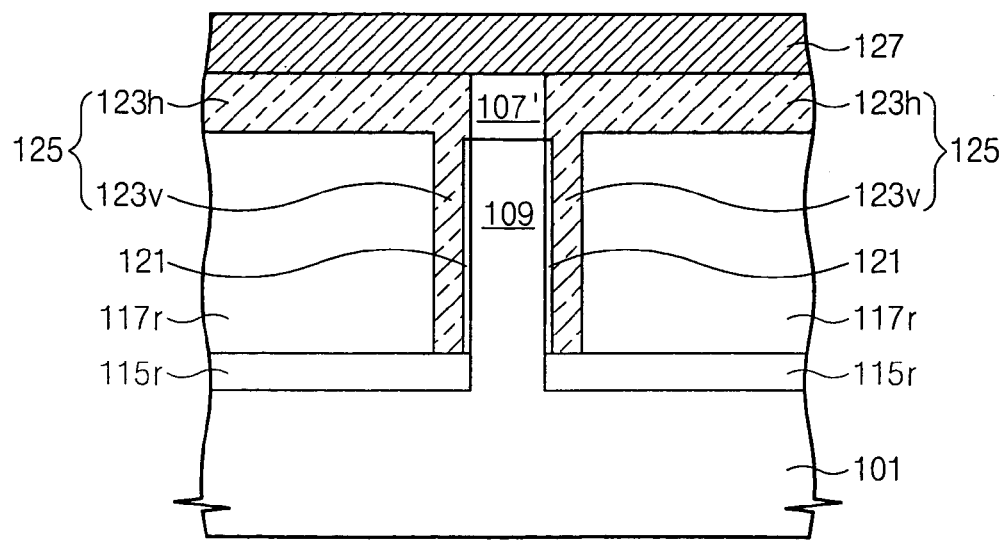
FIG. 17 and FIG. 18 are cross-sectional views FinFETs formed by performing post-processes of FIG. 16C, respectively.
Figure 18:
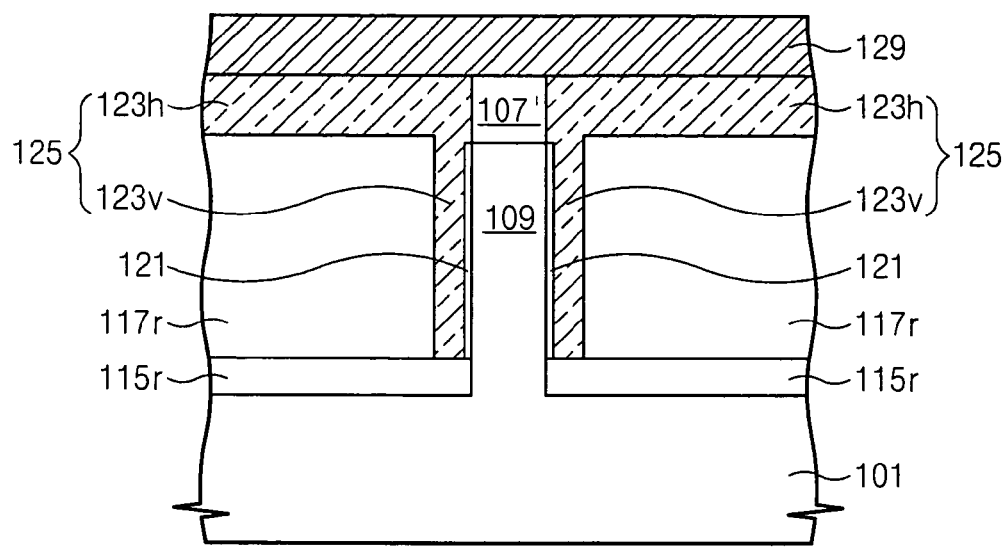

As a subsequent process, a gate forming process is performed to form a gate comprising a first gate and a second gate. The processes described with reference to FIG. 11A through FIG. 13A are performed to form a second gate 127 made of metal, as shown in FIG. 17. As a subsequent process, the processes described with reference to FIG. 15A through FIG. 15E are performed to form a second gate 129 made of silicide, as shown in FIG. 18.

Methods of forming a FinFET according to other embodiments of the present invention will now be described with reference to FIG. 19A through FIG. 19E. Unlike the embodiment described with reference to FIG. 6A and FIG. 13A, an oxide layer is further formed to surround the bottom side of a silicon fin before forming an oxide liner.

Figure 19A:
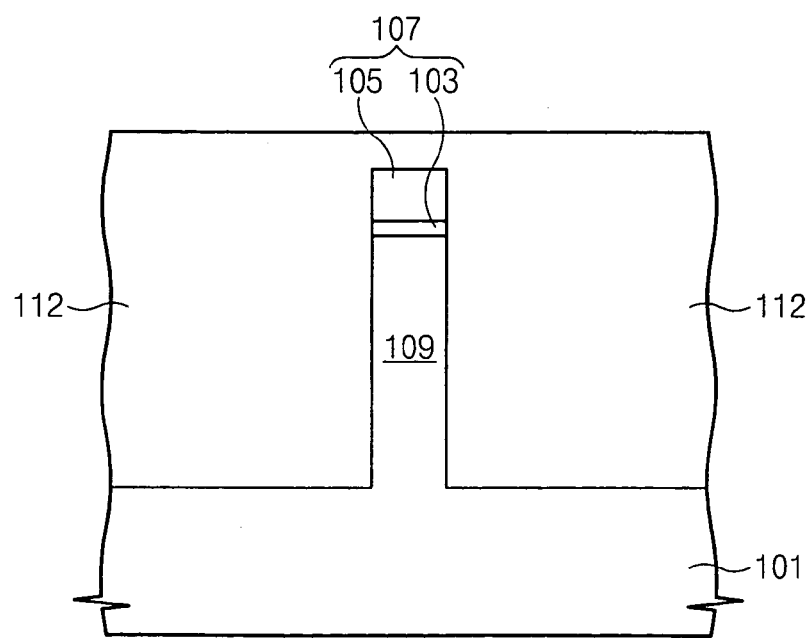
FIG. 19A through FIG. 19E are cross-sectional views to explain methods of forming a FinFET according to further embodiments of the present invention.

Referring to FIG. 19A, a pad oxide layer 103 and a pad nitride layer 105 are sequentially stacked on a substrate 101 to form a capping pattern 107. The substrate 101 is etched to form a silicon fin 109. An oxide layer 112 is formed to fill a trench 111, covering the silicon fin 109 and the capping pattern 107.

Figure 19B:
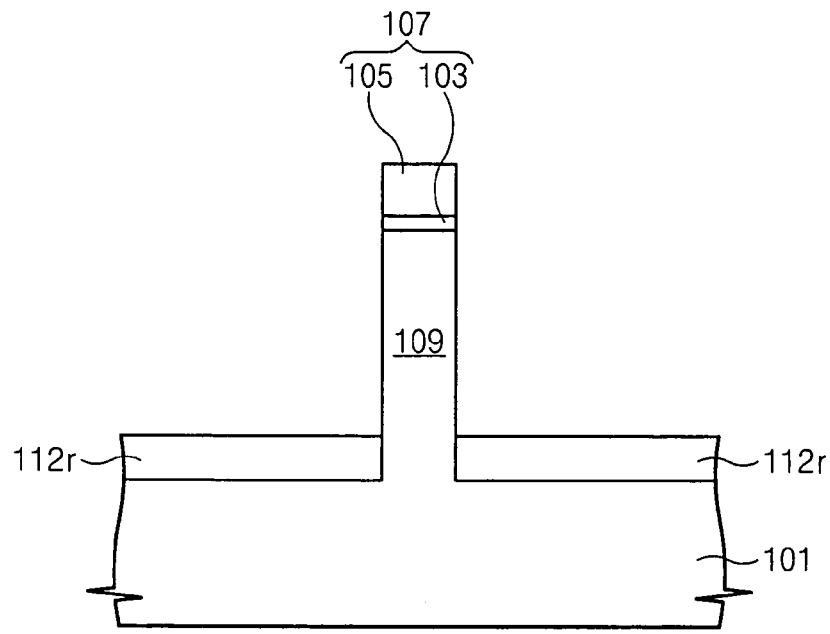

Referring to FIG. 19B, the oxide layer 112 is partially removed to expose sidewalls of the silicon fin 109. Thus the remaining portion of the oxide layer 112r covers the bottom side of the silicon fin 109. The partial removal of the oxide layer 112 may be done by performing a wet etch process or an etch-back process. Alternatively, the partial removal of the oxide layer 112 may be done by sequentially performing a planarizing process and an etch-back process. In the planarizing process, the capping pattern 107 is used as an etch-stop layer.

Figure 19C:
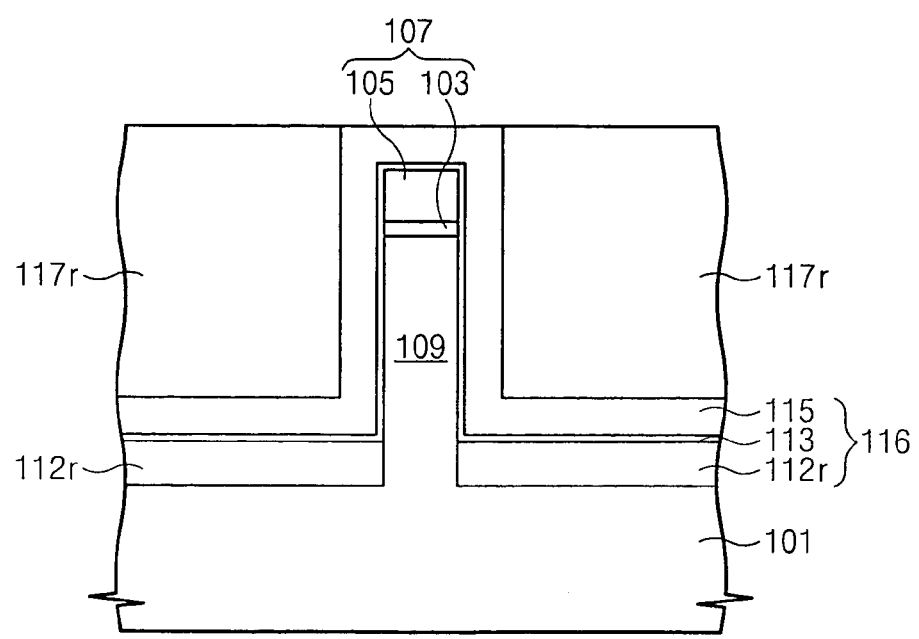

As subsequent processes, the processes described with reference to FIG. 8A through FIG. 13A are performed. Referring to FIG. 19C, an oxide liner 113, a nitride liner 115, and an upper insulation layer 117 are formed.

Figure 19D:
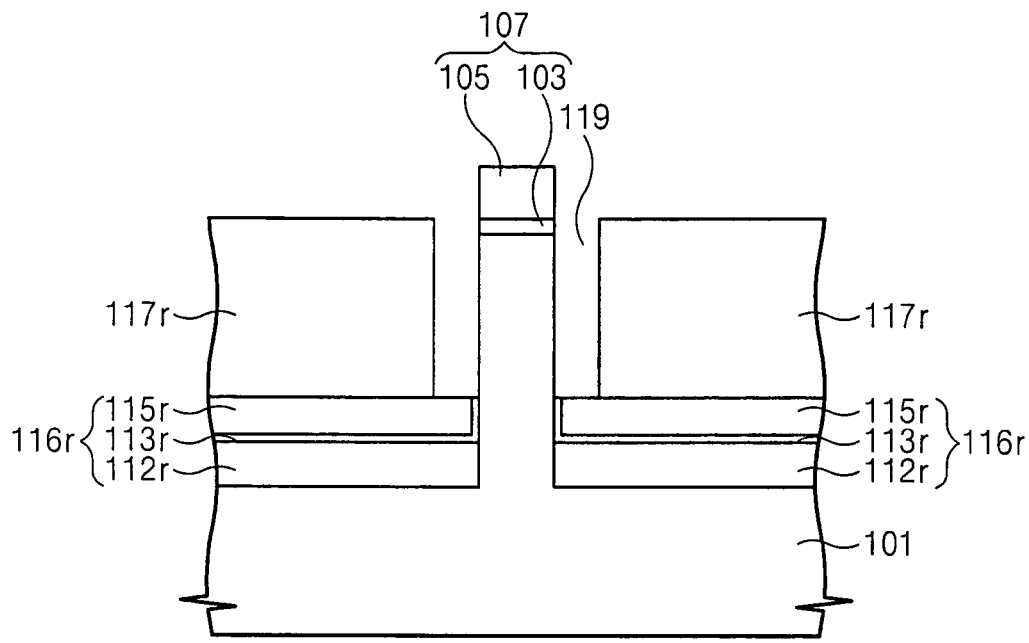

Referring to FIG. 19D, a height of the upper insulation layer 117 is lowered and the nitride liner 115 and the oxide liner 113 are partially removed to expose sidewall of a silicon fin 109. Remaining nitride liner 115r, oxide liner 113r, and oxide 112r constitute a lower insulation layer 116r.

Figure 19E:
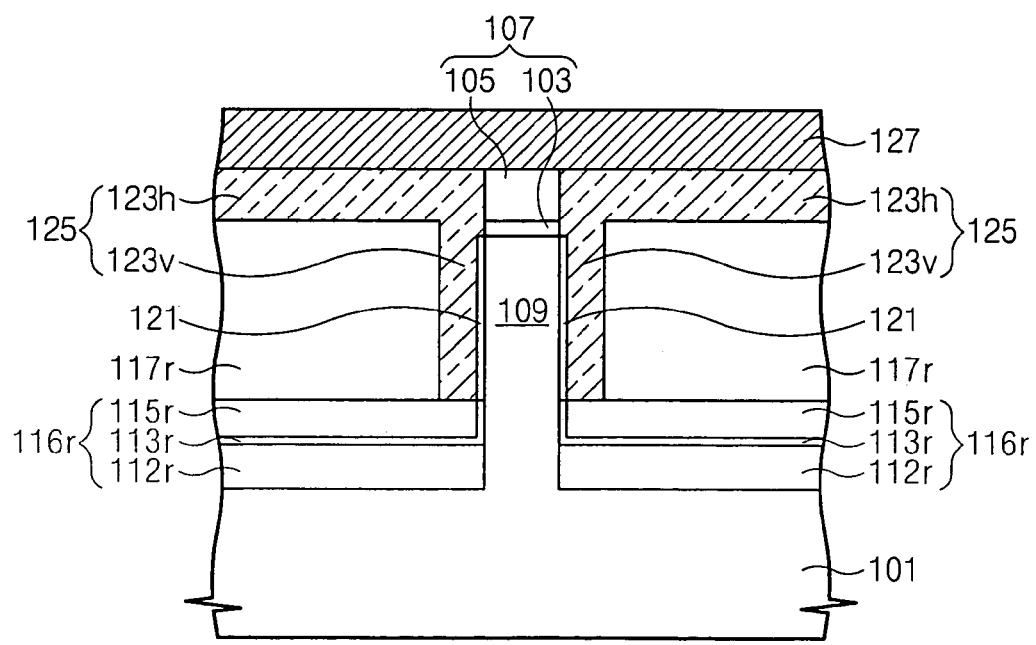

Referring to FIG. 19E, after a first gate material is deposited, a patterning process is performed. A metallic material is deposited and patterned to form a second gate 127. Alternatively, before depositing the metallic material, a silicide layer may be deposited. The first gate material outsides of the second gate 127 is removed to form a first gate 125 aligned below the second gate 127. As a subsequent process, an oblique ion implanting process is performed.

Figure 20A:
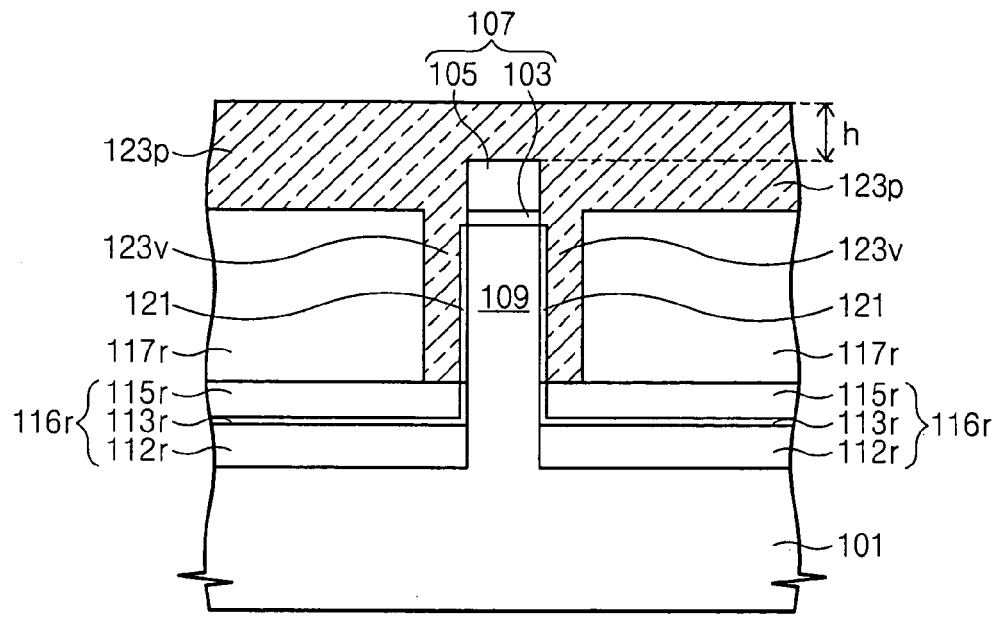
FIG. 20A through FIG. 20C are cross-sectional views to explain methods of forming a FinFET according to yet other embodiments of the present invention.

In these embodiments, a second gate made of metallic silicide may be formed by the same manner as described with reference to FIG. 15A through FIG. 15E. This will be described with reference to FIG. 20A through FIG. 20C, which are cross-sectional views taken along an extension line of the gate of FIG. 15A through FIG. 15E Referring to FIG. 20A, after the processes described with reference to FIG. 19A through FIG. 19D are performed, a first gate material is formed. The first gate material is planarized to allow a first gate material 123p to have a predetermined height "h" at a top surface of a capping pattern 107.

Figure 20B:
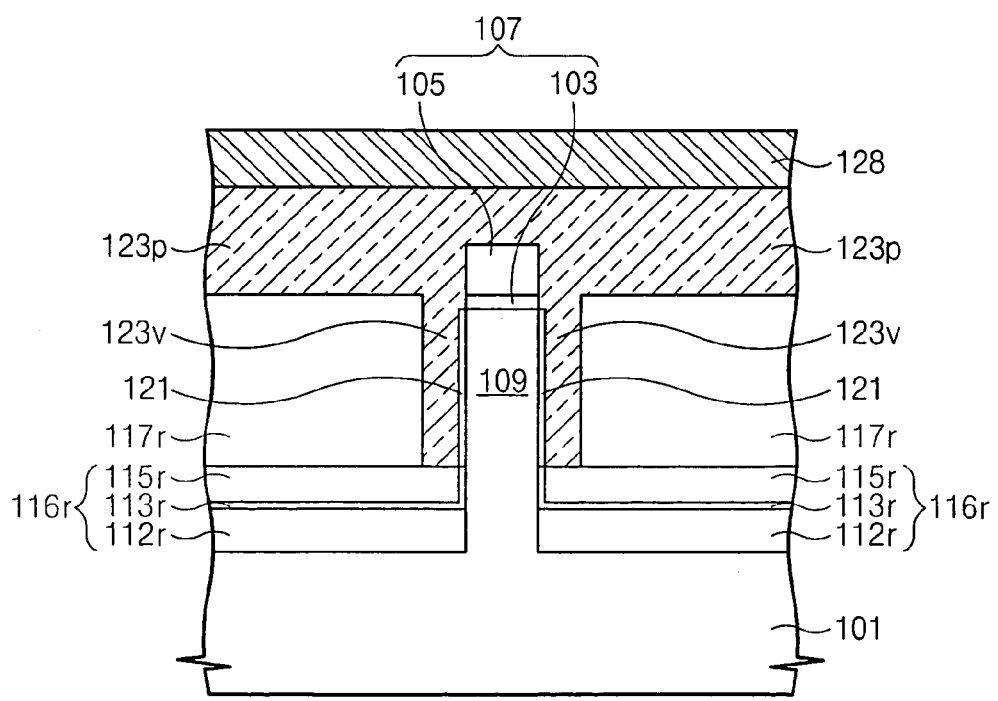

Referring to FIG. 20B, a sacrificial insulation pattern (126 of FIG. 15A) is formed on the first gate material 123p. The sacrificial insulation pattern has a groove to define a second gate. A metallic material 128 is formed on the sacrificial insulation pattern to fill the groove. The metallic material reacts on the polysilicon that is the first gate material.

Figure 20C:
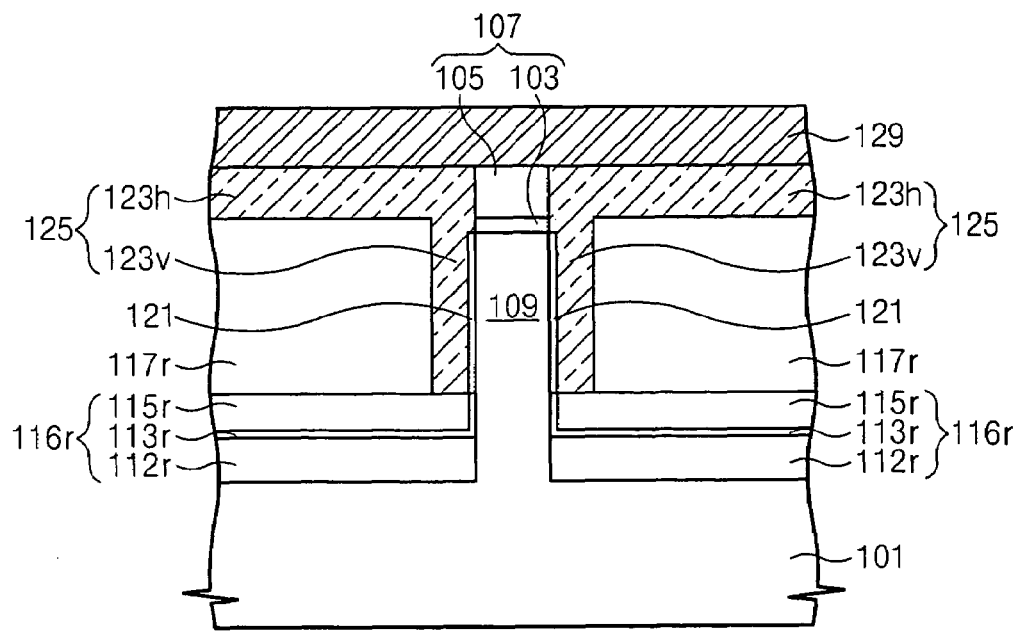

Referring to FIG. 20C, a conventional silicide annealing process is performed to form a silicide layer 129 as a second gate aligned below the groove. After removing an unreacting metallic material and a sacrificial insulation pattern, the first gate material 123p exposed by the silicide layer 129 is removed to form a first gate 125. An oblique ion implanting process is then performed to implant impurities into a vertical part 123v of the first gate 125.

Methods of forming a FinFET according to other embodiments of the present invention will now be described with reference to FIG. 21A and FIG. 21D. In these embodiments, a capping pattern is made of oxide.

Figure 21A:
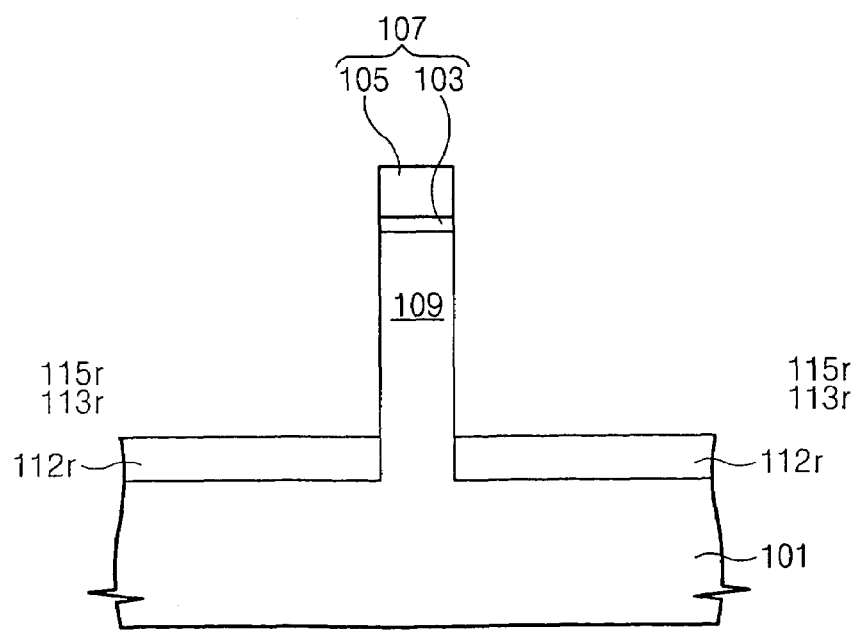
FIG. 21A through FIG. 21D are cross-sectional views to explain methods of forming a FinFET according to still further other embodiments of the present invention.

Referring to FIG. 21A, the processes described with reference to FIG. 19A and FIG. 19B are performed to form a capping pattern 107, a silicon fin 109, and an oxide layer 112r. The capping pattern 107 comprises a pad oxide layer 103 and a pad nitride layer 105.

Figure 21B:
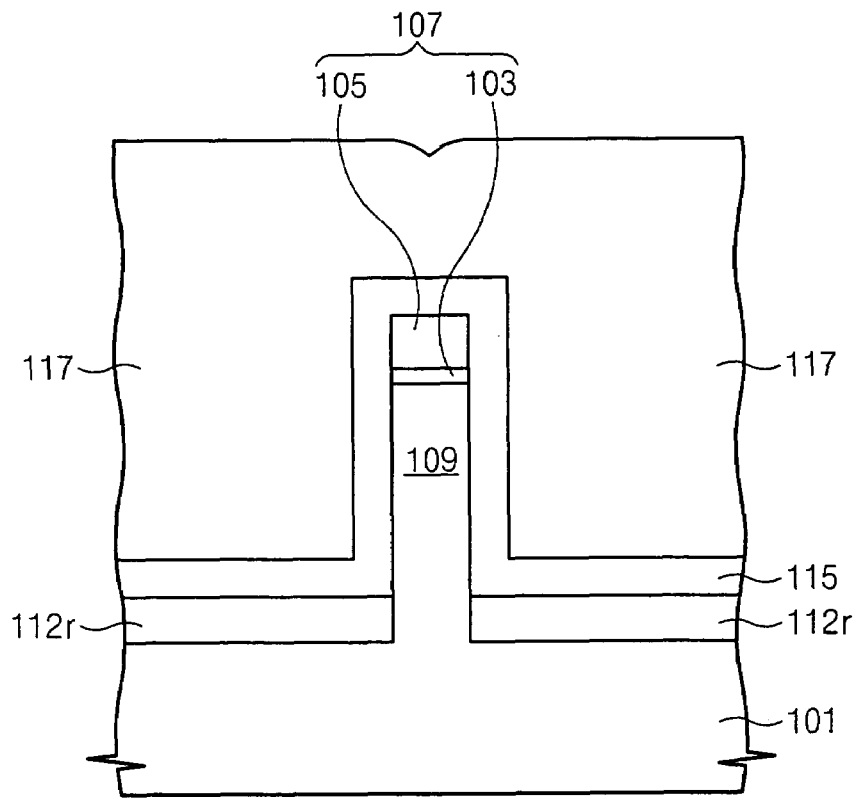

Referring to FIG. 21B, a nitride liner 115 is formed on the oxide layer 112r, the silicon fin 109, and the capping pattern 107. An upper insulation layer 117 is formed to cover the capping pattern 107 and the nitride liner 115.

Figure 21C:
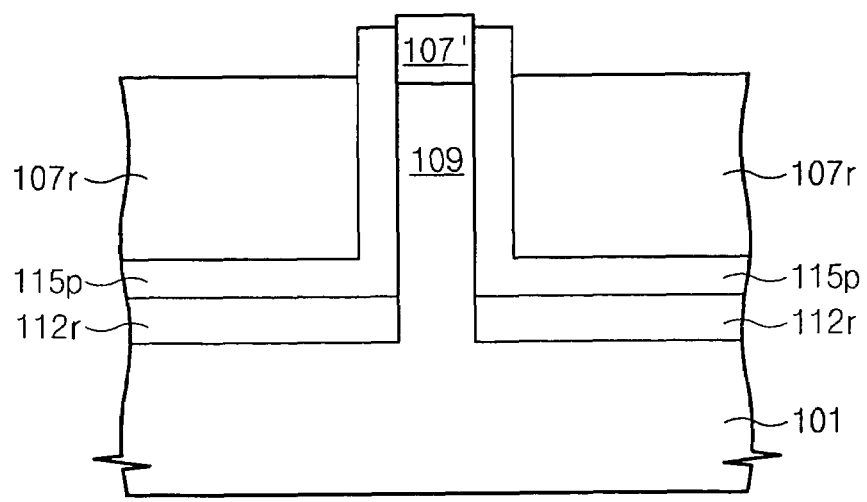

Referring to FIG. 21C, a planarizing process is performed to planarize the upper insulation layer 117, the nitride liner 115, and the pad nitride layer 105 of the capping pattern 107 down to a top surface of the pad oxide layer 103 of the capping pattern 107. A thermal oxidation process is performed to oxide a top of the silicon fin 109. Thus, a capping pattern 107' of oxide is formed. The planarized upper insulation layer is partially removed to make its height lower than a top surface of the capping pattern 107'.

Figure 21D:
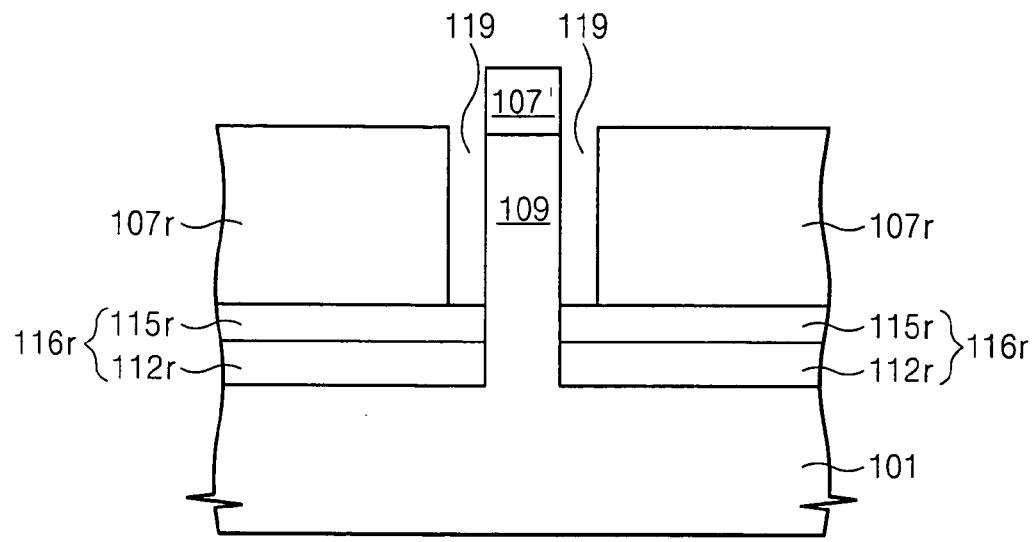

Referring to FIG. 21D, the nitride liner 115p is partially removed to expose a sidewall of the silicon fin 109.

Figure 22:
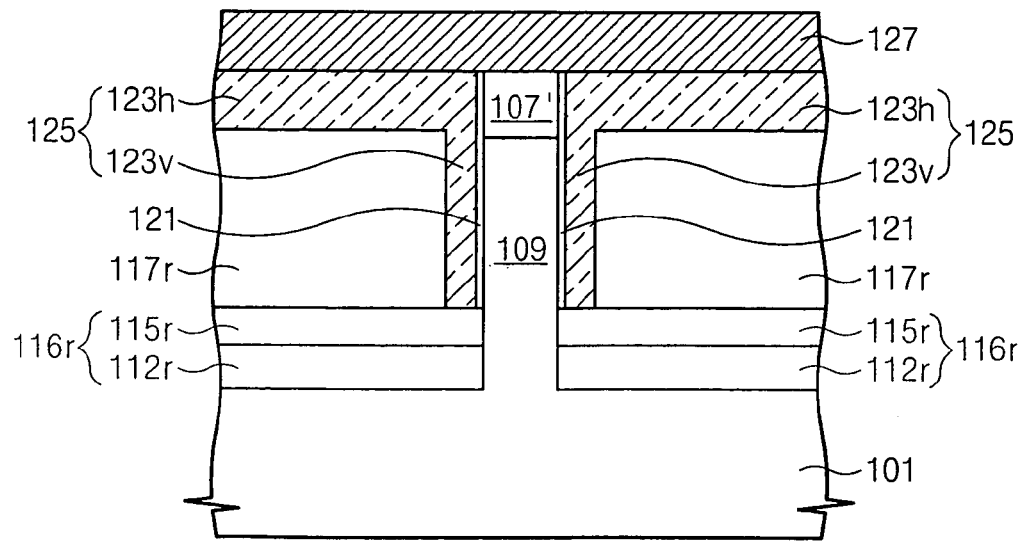
FIG. 22 and FIG. 23 are cross-sectional views of a FinFET formed by performing post-processes of FIG. 21D, respectively.
Figure 23:
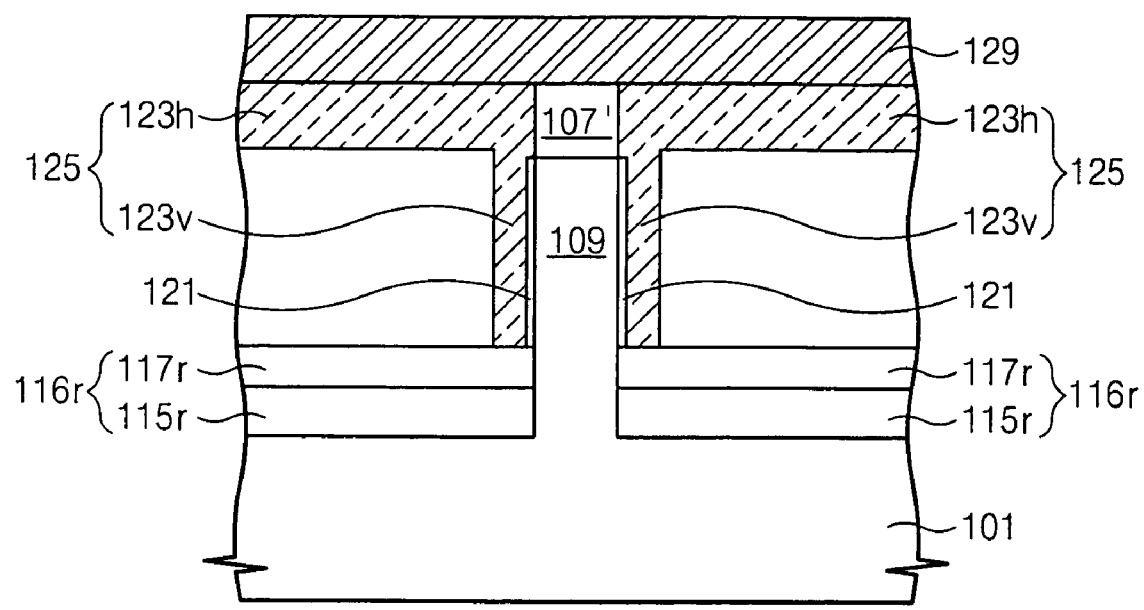

As a subsequent process, a gate forming process is performed to form a first gate 125 and a second gate. The processes described with reference to FIG. 11A through FIG. 13A are performed to a form a second gate made of metal, as shown in FIG. 22. On the other hand, the processes described with reference to FIG. 15A through FIG. 15E are performed to form a second gate 129 made of silicide, as shown in FIG. 23.

Methods of fabricating a semiconductor device of FIG. 4 will now be described in brief. Referring to FIG. 19A and FIG. 19B, after forming a silicon fin protected by a capping pattern, a lower insulation layer is formed to cover a bottom side of the silicon fin. A gate insulation layer is formed on a sidewall of the exposed silicon fin. A polysilicon material is deposited and a planarizing process is performed down to a top surface of the capping pattern. A metallic material is formed and a patterning process is performed. The metallic material and the polysilicon are etched to form a second gate and a first gate.

In the case where a second gate made of silicide is formed, the polysilicon should remain on a capping pattern to form a silicide layer on the capping pattern in a subsequent silicide process during planarizing process for the polysilicon. A gate is then formed by the same manner as described with reference to FIG. 15A through FIG. 15E, which is now explained in brief. A sacrificial oxide pattern having a groove is formed on the polysilicon layer. A metallic material for forming silicide is formed, and a silicide process is performed to form a silicide layer. An unreacting metallic material and the sacrificial oxide pattern are removed. Using the silicide layer as an etch mask, the underlying polysilicon is etched to complete formation of a gate.

While various methods of forming a FinFET using a bulk silicon substrate have been described, a person skilled in the art will readily understand that a FinFET may be formed on an SOI substrate without departing from the spirit of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
   a semiconductor fin having a capping pattern thereon and protruding away from a substrate;
   a first gate having a vertical part on opposite sidewalls of the capping pattern and the semiconductor fin and a horizontal part extending horizontally from the vertical part that is on the opposite sidewalls of the capping pattern, away from the semiconductor fin;
   a second gate having a lower resistivity than the first gate and disposed on the vertical part of the first gate and on the capping pattern; and
   a gate insulation layer disposed between the vertical part of the first gate and the semiconductor fin.

2. The semiconductor device as recited in claim 1, wherein the first gate comprises doped polysilicon.

3. The semiconductor device as recited in claim 2, wherein the second gate comprises metal, metallic silicide or metallic silicide and metal stacked.

4. The semiconductor device as recited in claim 3, wherein the capping pattern comprises oxide, nitride or oxide and nitride stacked and is relatively thicker than the gate insulation layer.

5. A semiconductor device comprising:
- a semiconductor fin having a capping pattern thereon and protruding away from a substrate;
- a first gate having a vertical part on opposite sidewalls of the capping pattern and the semiconductor fin and a horizontal part extending horizontally from the vertical part away from the semiconductor fin;
- a second gate having a lower resistivity than the first gate and disposed on the vertical part of the first gate and on the capping pattern;
- a gate insulation layer disposed between the vertical part of the first gate and the semiconductor fin;
- a lower insulation layer surrounding a bottom of the semiconductor fin; and
- an upper insulation layer surrounding the vertical part of the first gate while being spaced apart from the semiconductor fin and being in contact with a lower surface of the horizontal part of the first gate,
- wherein an upper surface of the upper insulation layer is planar.

6. The semiconductor device as recited in claim 5, wherein the lower insulation layer comprises oxide and nitride stacked or first oxide, second oxide, and nitride stacked, and the upper insulation layer comprises oxide, the second oxide being thinner than the first oxide and the nitride being thicker than the second oxide.

7. The semiconductor device as recited in claim 5, wherein the lower insulation layer comprises nitride or oxide and nitride stacked, and the upper insulation layer comprises oxide.

8. The semiconductor device as recited in claim 5, wherein the capping pattern comprises oxide, nitride or oxide and nitride stacked and is thicker than the gate insulation layer.

9. A semiconductor device comprising:
- a semiconductor fin having a capping pattern thereon and protruding away from a substrate;
- a first gate having a vertical part on opposite sidewalls of the capping pattern and the semiconductor fin and a horizontal part extending horizontally from the vertical part away from the semiconductor fin;
- a second gate having a lower resistivity than the first gate and disposed on the vertical part of the first gate and on the capping pattern;
- a gate insulation layer disposed between the vertical part of the first gate and the semiconductor fin;
- a buried oxide layer disposed between the substrate and the semiconductor fin;
- a nitride layer disposed on the buried oxide layer to cover the bottom of the semiconductor fin; and
- an oxide layer filling a space defined by a sidewall of the vertical part of the first gate, a lower side of the horizontal part of the first gate, and the nitride layer,
- wherein the semiconductor fin is insulated from the substrate by the buried oxide layer.

10. The semiconductor device as recited in claim 9, wherein the capping pattern comprises oxide, nitride or oxide and nitride stacked and is thicker than the gate insulation layer.

11. A semiconductor device comprising:
- a semiconductor fin having a capping pattern thereon and protruding away from a substrate;
- a first gate having a vertical part on opposite sidewalls of the capping pattern and the semiconductor fin and a horizontal part extending horizontally from the vertical part away from the semiconductor fin;
- a second gate having a lower resistivity than the first gate and disposed on the vertical part of the first gate and on the capping pattern; and
- a gate insulation layer disposed between the vertical part of the first gate and the semiconductor fin;
- wherein a top of the vertical part of the first gate and a top of the horizontal part of the first gate have same or lower height as a top of the capping pattern, and have same or higher height as the top of the semiconductor fin.

12. A semiconductor device comprising:
- a semiconductor fin having a capping pattern thereon and protruding away from a substrate;
- a first gate covering opposite sidewalls of the capping pattern and the semiconductor fin with a gate insulation layer interposed therebetween; and
- a second gate having a lower resistivity than the first gate and disposed directly on the first gate and directly on the capping pattern.

13. The semiconductor device as recited in claim 12, wherein the first gate comprises polysilicon, and the second gate comprises metal of low resistivity, silicide or metal and silicide stacked.

14. The semiconductor device as recited in claim 12, wherein the first gate comprises a vertical part on opposite sidewalls of the capping pattern and the semiconductor fin and a horizontal part extending horizontally from the vertical part, wherein the second gate is disposed directly on the horizontal part.

15. The semiconductor device as recited in claim 12, wherein the second gate comprises silicide and metal on the silicide, wherein the silicide is disposed directly on the first gate and directly on the capping layer.

* * * * *